US008553167B2

(12) United States Patent
Okamoto et al.

(10) Patent No.: US 8,553,167 B2
(45) Date of Patent: Oct. 8, 2013

(54) PORTABLE ELECTRONIC DEVICE

(75) Inventors: Satoru Okamoto, Kanagawa (JP);
Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/309,797

(22) Filed: Dec. 2, 2011

(65) Prior Publication Data

US 2012/0075225 A1    Mar. 29, 2012

Related U.S. Application Data

(63) Continuation of application No. 13/079,552, filed on Apr. 4, 2011, now Pat. No. 8,405,790, which is a continuation of application No. 12/239,138, filed on Sep. 26, 2008, now Pat. No. 7,920,215, which is a continuation of application No. 09/934,699, filed on Aug. 22, 2001, now Pat. No. 7,430,025.

(30) Foreign Application Priority Data

Aug. 23, 2000 (JP) ................................. 2000-252717

(51) Int. Cl.
*G02F 1/136* (2006.01)
*G02F 1/1335* (2006.01)

(52) U.S. Cl.
USPC ................. 349/48; 349/12; 349/69; 349/151; 345/76; 345/173; 345/92; 315/169.3

(58) Field of Classification Search
USPC ............... 349/12, 48, 43, 138, 149, 150, 151, 349/69; 315/169.3; 345/76, 92, 173, 207
See application file for complete search history.

(56) References Cited

U.S. PATENT DOCUMENTS

| 4,580,877 A | 4/1986 | Washo |
| 4,720,781 A | 1/1988 | Crossland et al. |
| 4,809,078 A | 2/1989 | Yabe et al. |
| 4,996,523 A | 2/1991 | Bell et al. |
| 5,262,654 A | 11/1993 | Yamazaki |
| 5,399,502 A | 3/1995 | Friend et al. |

(Continued)

FOREIGN PATENT DOCUMENTS

| EP | 0 365 445 A2 | 4/1990 |
| EP | 0 797 342 A1 | 9/1997 |

(Continued)

OTHER PUBLICATIONS

Office Action re Japanese application No. JP 2012-173596, dated Sep. 4, 2012 (with English translation).

(Continued)

*Primary Examiner* — Thoi Duong
(74) *Attorney, Agent, or Firm* — Husch Blackwell LLP

(57) ABSTRACT

When image data is displayed on the display portion of a conventional mobile telephone, characters cannot be displayed thereon, and thus the image data and the characters cannot be simultaneously displayed. In a portable electronic device according to the present invention, a cover member having a first display device (101) for displaying an image (digital still image or the like) and a second display device (102) having a touch input operational portion (for displaying characters, symbols, or the like) are attached to each other so as to allow opening and closing.

44 Claims, 13 Drawing Sheets

(56) References Cited

U.S. PATENT DOCUMENTS

| | | |
|---|---|---|
| 5,734,914 A | 3/1998 | Nakamura et al. |
| 5,742,279 A | 4/1998 | Yamamoto et al. |
| 5,838,308 A | 11/1998 | Knapp et al. |
| 5,852,481 A | 12/1998 | Hwang |
| 5,893,730 A | 4/1999 | Yamazaki et al. |
| 6,037,635 A | 3/2000 | Yamazaki |
| 6,069,648 A | 5/2000 | Suso et al. |
| 6,072,454 A | 6/2000 | Nakai et al. |
| 6,091,449 A | 7/2000 | Matsunaga et al. |
| 6,098,055 A | 8/2000 | Watanabe |
| 6,125,286 A | 9/2000 | Jahagirdar et al. |
| 6,158,884 A | 12/2000 | Lebby et al. |
| 6,191,764 B1 | 2/2001 | Kono et al. |
| 6,239,839 B1 | 5/2001 | Matsunaga et al. |
| 6,262,785 B1 | 7/2001 | Kim |
| 6,265,833 B1 | 7/2001 | Kim et al. |
| 6,274,887 B1 | 8/2001 | Yamazaki et al. |
| 6,277,679 B1 | 8/2001 | Ohtani |
| 6,282,183 B1 | 8/2001 | Harris et al. |
| 6,300,978 B1 | 10/2001 | Matsunaga et al. |
| 6,341,133 B1 | 1/2002 | Kawamoto et al. |
| 6,346,973 B1 | 2/2002 | Shibamoto et al. |
| 6,362,798 B1 | 3/2002 | Kimura et al. |
| 6,369,865 B2 | 4/2002 | Hinata |
| 6,377,324 B1 | 4/2002 | Katsura |
| 6,380,011 B1 | 4/2002 | Yamazaki et al. |
| 6,384,427 B1 | 5/2002 | Yamazaki et al. |
| 6,396,924 B1 | 5/2002 | Suso et al. |
| 6,424,326 B2 | 7/2002 | Yamazaki et al. |
| 6,441,560 B1 | 8/2002 | Hunter |
| 6,452,341 B1 | 9/2002 | Yamauchi et al. |
| 6,452,577 B1 | 9/2002 | Gale et al. |
| 6,462,722 B1 | 10/2002 | Kimura et al. |
| 6,486,890 B1 | 11/2002 | Harada et al. |
| 6,510,325 B1 | 1/2003 | Mack, II et al. |
| 6,541,918 B1 | 4/2003 | Yudasaka |
| 6,597,349 B1 | 7/2003 | Koyama et al. |
| 6,605,826 B2 | 8/2003 | Yamazaki et al. |
| 6,611,097 B1 | 8/2003 | Hanahara et al. |
| 6,618,029 B1 | 9/2003 | Ozawa |
| 6,670,637 B2 | 12/2003 | Yamazaki et al. |
| 6,795,121 B2 | 9/2004 | Matsunaga et al. |
| 6,812,954 B1 | 11/2004 | Priestman et al. |
| 6,821,553 B2 | 11/2004 | Miyashita et al. |
| 6,822,629 B2 | 11/2004 | Yamazaki et al. |
| 6,853,004 B2 | 2/2005 | Ohtani |
| 6,967,632 B1 | 11/2005 | Minami et al. |
| 6,972,753 B1 * | 12/2005 | Kimura et al. ............ 345/175 |
| 7,030,551 B2 | 4/2006 | Yamazaki et al. |
| 7,113,213 B2 | 9/2006 | Matsunaga et al. |
| 7,173,584 B2 | 2/2007 | Kimura et al. |
| 7,189,999 B2 | 3/2007 | Yamazaki et al. |
| 7,194,085 B2 | 3/2007 | Yamazaki et al. |
| 7,208,765 B2 | 4/2007 | Yamazaki et al. |
| 7,253,441 B2 | 8/2007 | Ohtani |
| 7,339,317 B2 | 3/2008 | Yamazaki |
| 7,369,169 B2 | 5/2008 | Matsunaga et al. |
| 7,397,451 B2 | 7/2008 | Ozawa |
| 7,400,087 B2 | 7/2008 | Yamazaki |
| 7,446,340 B2 | 11/2008 | Ohtani |
| 7,453,089 B2 | 11/2008 | Yamazaki et al. |
| 7,460,094 B2 | 12/2008 | Ozawa |
| 7,489,777 B2 | 2/2009 | Yamazaki et al. |
| 7,560,860 B2 | 7/2009 | Yamazaki et al. |
| 7,656,391 B2 | 2/2010 | Kimura et al. |
| 7,786,544 B2 | 8/2010 | Yamazaki et al. |
| 7,915,808 B2 | 3/2011 | Yamazaki |
| 8,058,699 B2 | 11/2011 | Yamazaki et al. |
| 8,106,407 B2 | 1/2012 | Yamazaki et al. |
| 2001/0013901 A1 | 8/2001 | Matsunaga et al. |
| 2002/0049714 A1 | 4/2002 | Yamazaki et al. |
| 2002/0070913 A1 | 6/2002 | Kimura et al. |
| 2002/0086711 A1 | 7/2002 | Flannery |
| 2002/0089589 A1 | 7/2002 | Adair et al. |
| 2002/0158823 A1 | 10/2002 | Zavracky et al. |
| 2003/0151568 A1 | 8/2003 | Ozawa |
| 2006/0256047 A1 | 11/2006 | Kimura et al. |
| 2008/0158209 A1 | 7/2008 | Ozawa |
| 2008/0165174 A1 | 7/2008 | Ozawa |
| 2008/0198152 A1 | 8/2008 | Ozawa |
| 2008/0316152 A1 | 12/2008 | Kimura et al. |
| 2009/0026970 A1 | 1/2009 | Ohtani |
| 2009/0239580 A1 | 9/2009 | Yamazaki et al. |
| 2009/0270134 A1 | 10/2009 | Yamazaki et al. |
| 2010/0134435 A1 | 6/2010 | Kimura et al. |
| 2011/0122124 A1 | 5/2011 | Kimura et al. |
| 2011/0156580 A1 | 6/2011 | Yamazaki |
| 2011/0165918 A1 | 7/2011 | Yamazaki et al. |
| 2011/0181537 A1 | 7/2011 | Okamoto et al. |
| 2012/0007090 A1 | 1/2012 | Yamazaki et al. |
| 2012/0075785 A1 | 3/2012 | Okamoto et al. |
| 2012/0077543 A1 | 3/2012 | Okamoto et al. |

FOREIGN PATENT DOCUMENTS

| | | |
|---|---|---|
| EP | 0 845 900 A1 | 6/1998 |
| EP | 0 935 229 A1 | 8/1999 |
| EP | 0 938 074 A1 | 8/1999 |
| EP | 1 003 150 A1 | 5/2000 |
| EP | 1 505 650 A2 | 2/2005 |
| EP | 1 505 651 A2 | 2/2005 |
| EP | 1 505 652 A2 | 2/2005 |
| EP | 1 594 116 A2 | 11/2005 |
| EP | 2 112 693 A2 | 10/2009 |
| EP | 2 237 256 A2 | 10/2010 |
| EP | 2 280 389 A1 | 2/2011 |
| JP | 62-186320 | 8/1987 |
| JP | 63-118186 | 5/1988 |
| JP | 2-148687 | 6/1990 |
| JP | 4-239960 | 8/1992 |
| JP | 5-298257 | 11/1993 |
| JP | 8-234162 | 9/1996 |
| JP | 8-288069 | 11/1996 |
| JP | 9-305259 | 11/1997 |
| JP | 10-91342 | 4/1998 |
| JP | 10-134959 | 5/1998 |
| JP | 10-171757 | 6/1998 |
| JP | 10-177430 | 6/1998 |
| JP | 10-319872 | 12/1998 |
| JP | 11-24606 | 1/1999 |
| JP | 11-65763 | 3/1999 |
| JP | 11-122398 | 4/1999 |
| JP | 11-167373 | 6/1999 |
| JP | 11-224781 | 8/1999 |
| JP | 11-272233 | 10/1999 |
| JP | 11-313170 | 11/1999 |
| JP | 11-327715 | 11/1999 |
| JP | 11-327727 | 11/1999 |
| JP | 2000-3652 | 1/2000 |
| JP | 2000-39856 | 2/2000 |
| JP | 2000-122615 | 4/2000 |
| JP | 2000-152082 | 5/2000 |
| JP | 2000-172199 | 6/2000 |
| JP | 2000-172444 | 6/2000 |
| JP | 2000-184026 | 6/2000 |
| JP | 2000-201213 | 7/2000 |
| JP | 2000-222555 | 8/2000 |
| JP | 2000-223715 | 8/2000 |
| JP | 2001-125699 | 5/2001 |
| JP | 2001-195015 | 7/2001 |
| JP | 2001-339492 | 12/2001 |
| JP | 3338423 | 10/2002 |
| JP | 2011-135592 | 7/2011 |
| WO | WO 97/07631 A1 | 2/1997 |
| WO | WO 97/14244 A1 | 4/1997 |
| WO | WO 99/46748 A1 | 9/1999 |

OTHER PUBLICATIONS

Office Action re Japanese application No. JP 2012-173592, dated Oct. 2, 2012 (with English translation).

* cited by examiner

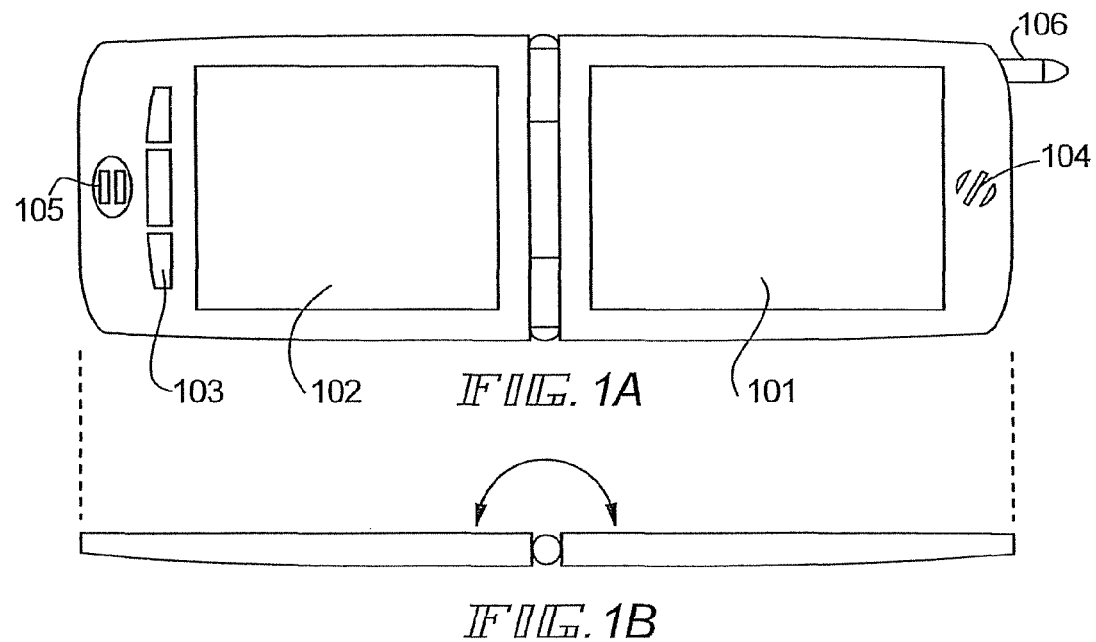
FIG. 1A
FIG. 1B
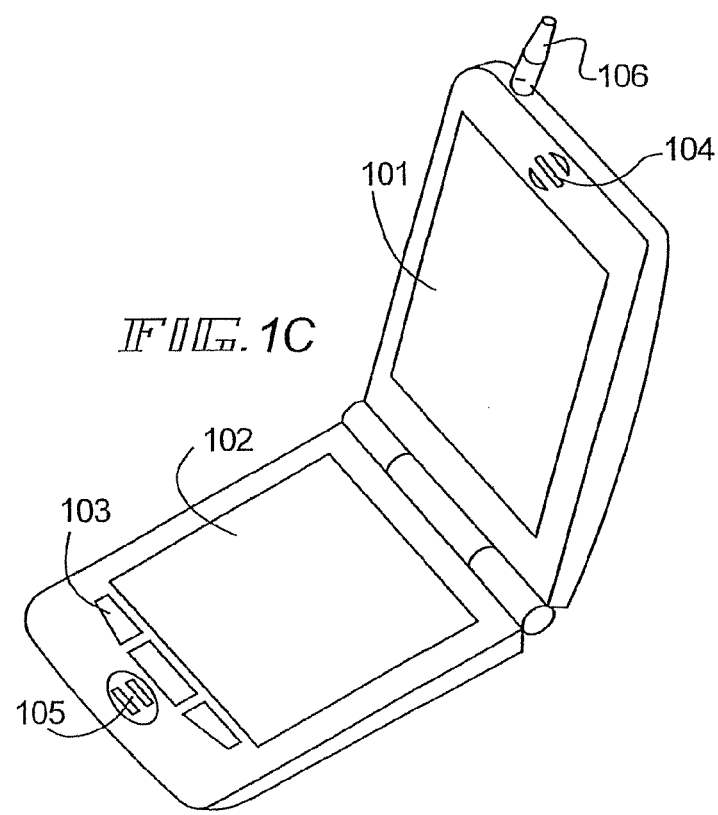
FIG. 1C

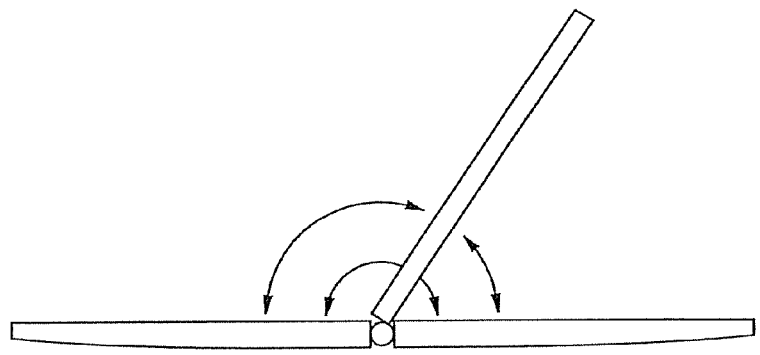
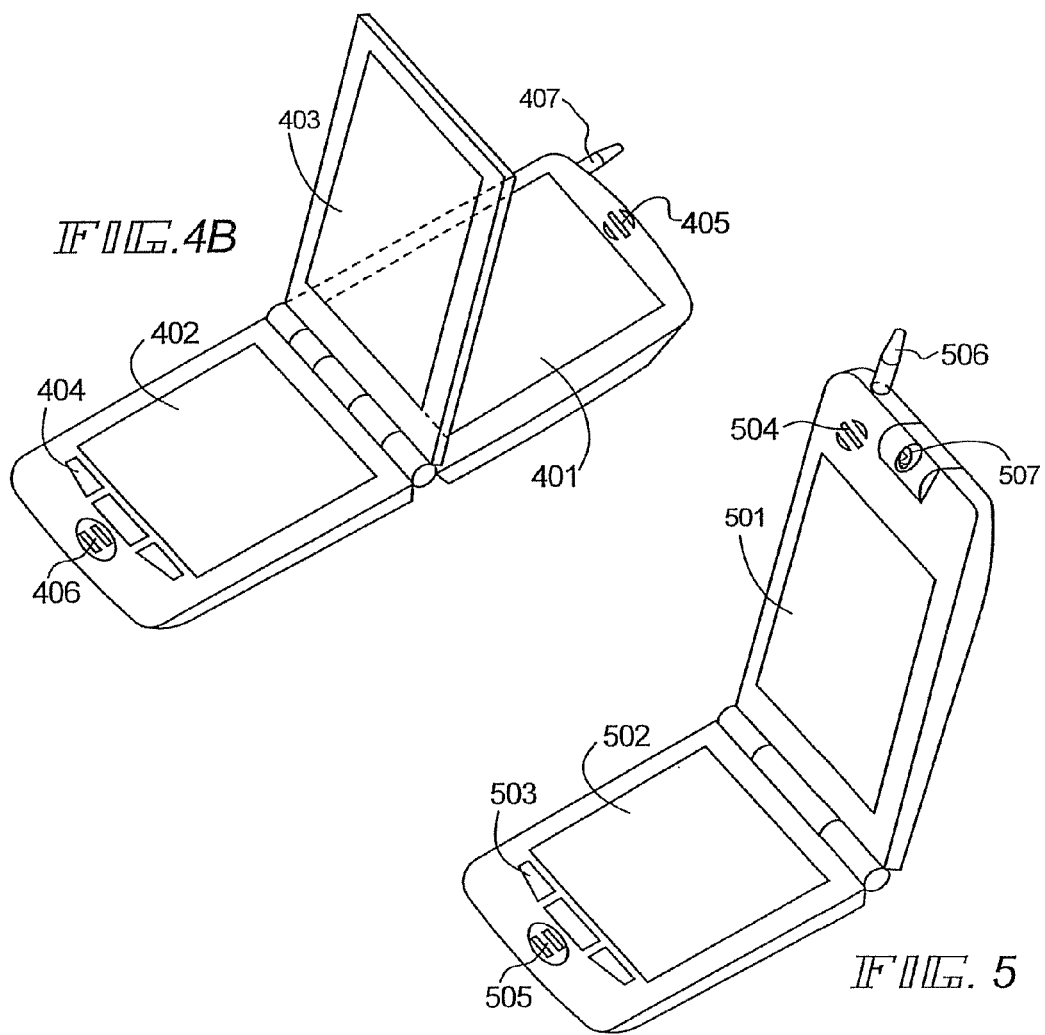

A ⟵ PIXEL TFT PORTION ⟶ ⟵ CAPACITOR PORTION ⟶ A'

PORTABLE ELECTRONIC DEVICE

This application is a continuation of copending U.S. application Ser. No. 13/079,552, filed on Apr. 4, 2011 which is a continuation of U.S. application Ser. No. 12/239,138, filed on Sep. 26, 2008 (now U.S. Pat. No. 7,920,215 issued Apr. 5, 2011) which is a continuation of U.S. application Ser. No. 09/934,699, filed on Aug. 22, 2001 (now U.S. Pat. No. 7,430,025 issued Sep. 30, 2008).

BACKGROUND OF THE INVENTION

1. Field of the Invention

The present invention relates to a portable electronic device having a display portion with a circuit composed of thin film transistors (hereinafter referred to as TFTs), for example, a portable electronic device equipped with a display device such as a liquid crystal display panel as the display portion.

Note that the portable electronic device in this specification means a portable information processing device in general, and includes a mobile telephone, a mobile television telephone, a portable computer, and the like.

2. Description of the Related Art

Conventionally, in a mobile telephone, one liquid crystal display device is normally used as the display portion. Further, because of a demand for miniaturization, there is a limitation to the size of the screen of the display portion.

Also, recently, the communication technology has progressed, and thus sending and receiving of electronic mails and access to home pages on the Internet can be made by using the mobile telephone.

Recently, although it is possible to send and receive of electronic mails by the mobile telephone, communication with only characters in a text form is possible. Thus, even when a message to which image data is attached by, for example, a personal computer or the like is received, the image data cannot be displayed on the display portion of the mobile telephone.

Also, even in the access to a home page on the Internet, image data on the home page cannot be displayed on the display portion of the mobile telephone.

Display of characters (text) or a simple image is sufficient in a display portion of a conventional mobile telephone. Thus, it is not necessary to use a high resolution display portion. Also, it is not necessary to use a full color display portion.

However, since it has been possible to communicate by electronic mails of the mobile telephone in recent years, a high resolution and full color display portion is greatly required. Among various mobile telephones, although a mobile telephone capable of displaying image data has been on sale, many mobile telephones have two-color display such as white and black. Thus, although there is the case where the full color display portion is used, image quality is low and it is difficult to see the image.

Also, when the image data is displayed on the display portion, the characters (text) cannot be displayed thereon. That is, the image data and the characters (text) cannot be simultaneously displayed.

SUMMARY OF THE INVENTION

In accordance with the present invention, there is provided a portable electronic device comprising:
a first display device for displaying an image; and
a second display device having a touch input operational portion,
wherein the first display device and the second display device are attached to each other in a longitudinal direction or in a lateral direction. Note that in the electronic device shown in FIG. 2, the first display device and the second display device are attached to each other in the longitudinal direction.

In another aspect of the present invention, there is provided a portable electronic device comprising:
a cover member having a first display device for displaying an image: and
a second display device having a touch input operational portion,
wherein the cover member and the second display device are attached to each other so as to allow opening and closing. Note that in the electronic device shown in FIGS. 1A to 1C, the cover member and the second display device are attached to each other so as to allow opening and closing.

Also, the configuration as shown in FIGS. 3A to 3C, that is, a third display device may be provided between the cover member and the second display device. A fourth display device and a fifth display device may be provided to increase the number of screens and thus the display region may be expanded. The third display device may be equipped with an image pickup device or a sensor. Also, the third display device may be equipped with a system for identifying the user.

Also, in the above structures, not only the second display device but also the first display device may be equipped with a touch input operational portion.

Also, in the above structures, the second display device may specially display a character or a symbol without a high resolution screen. If such a structure is obtained, the first display device has a higher resolution than that of the second display device, and thus an increase in cost is suppressed. For example, an electric device in which a TFT formed of a semiconductor layer of polysilicon is used for the first display device, and a TFT formed of a semiconductor layer of amorphous silicon is used for the second display device may be used.

Also, in the above structures, an image pickup device or a sensor may be attached to the first display device or the second display device, or provided in each pixel.

Also, in the above structures, the first display device or the second display device may be equipped with a system for identifying the user.

Also, in the above structures, the first display device, the second display device, or the third display device may be suitably a liquid crystal display device or an EL display device. Further, as the first display device, the second display device, or the third display device, another display device, for example, an electrochemical display, a field emission display, a plasma display, a DMD, or the like can be used.

In still another aspect of the present invention, there is provided a portable electronic device comprising:
a cover member having an EL display device for displaying an image; and
a reflection display device,
wherein the cover member and the reflection display device are attached to each other so as to allow opening and closing and the reflection display device is made to display by irradiating light emitted from the EL display device.

In the above structure, the reflection display device may be equipped with a touch input operational portion.

Also, in the above structures, the portable electronic device is a electronic device having a communication function, and typically is a mobile telephone or a personal digital assistant.

BRIEF DESCRIPTION OF THE DRAWINGS

In the accompanying drawings:

FIGS. 1A to 1C are a top view, a side view, and a perspective view of the present invention (Embodiment 1), respectively;

FIGS. 4A and 4B are a side view and a perspective view of the present invention (Embodiment 3), respectively;

FIG. 5 is a perspective view of the present invention (Embodiment 4);

DETAILED DESCRIPTION OF THE PREFERRED EMBODIMENTS

Figure 2:
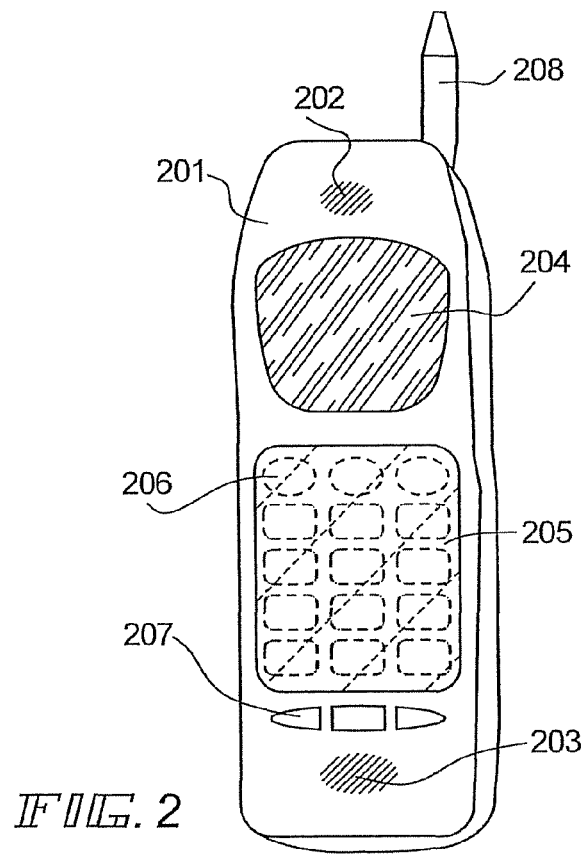
FIG. 2 is a top view of the present invention (Embodiment 2)

An embodiment mode of the present invention will be described below.

FIGS. 1A to 1C are a top view, a side view, and a perspective view, respectively, of a mobile telephone as one example of a portable electronic device according to the present invention.

The mobile telephone shown in FIG. 1A to 1C has a first display device 101 mainly for color-display of an image with high image quality and a second display device 102 for displaying mainly characters or symbols.

Also, at least one of the first display device 101 and the second display device 102 has a touch input operational portion. The screen in which the touch input operational portion is provided has the function of an operational switch.

The electronic equipment shown in FIGS. 1A to 1C is a portable electronic device in which a cover member having the first display device 101 for displaying an image (digital still image or the like) and the second display device 102 having the touch input operational portion (for displaying characters, symbols, or the like) are attached to each other so as to allow opening and closing. The mobile telephone shown in FIGS. 1A to 1C is collapsible. The present invention can be implemented in a mode shown in FIG. 2. However, since the display portion can be protected, the collapsible mobile telephone as shown in FIGS. 1A to 1C is preferable.

Also, in the case of the collapsible mobile telephone shown in FIGS. 1A to 1C, an EL display device may be used as the first display device 101 and a reflection liquid crystal display device may be used as the second display device 102. In this case, when the display screen of the first display device 101 is brought close to the second display device 102 by light folding, even under low light conditions, the screen of the second display device 102 can be visually identified utilizing the light emitted from an EL element in the first display device 101.

Also, the electronic device shown in FIGS. 1A to 1C has several operational buttons 103, a voice output portion 104, a voice input portion 105, and an antenna 106.

Also, as shown in FIG. 2, a portable electronic device may be one in which a first display device 204 for displaying an image and a second display device 205 having a touch input operational portion are attached to each other in a longitudinal arrangement.

Also, as shown in FIGS. 4A and 4B, a portable electronic device may be one in which a first display device 401 and a second display device 402 are attached to each other so as to allow opening and closing with a third display device 403 therebetween.

Also, as shown in FIG. 5, a portable electronic device may be equipped with an image input portion 507 such as a CCD image pickup device.

Also, the first display device 401, the second display device 402, or the third display device 403 may be provided with a sensor for authentication of users. As the authentication of users, living body information (typically, fingerprint, palmar pattern, voice print, or the like) may be utilized.

Note that a liquid crystal display device or an EL display device can be used as the first display device 401, the second display device 402, or the third display device 403.

In the present invention with the above structure, embodiments indicated below will be described in detail.

Embodiment 1

In this embodiment, the collapsible portable electronic device shown in FIGS. 1A to 1C will be described. FIG. 1A is a top view, FIG. 1B is a side view, and FIG. 1c is a perspective view.

In FIGS. 1A to 1C, reference numeral 101 denotes a first display device, numeral 102 denotes a second display device, numeral 103 denotes an operational switch, numeral 104 denotes a voice output portion, numeral 105 denotes a voice input portion, and numeral 106 denotes an antenna.

In this embodiment, an EL display device capable of displaying an image with high quality is used as the first display device 101 and a liquid crystal display device is used as the second display device 102. Also, a touch panel system is employed for the second display device 102. In the case of the liquid crystal display device, it is necessary to convert a received digital signal into an analog signal. However, when the EL display device is used as the first display device 101, since a digital image can be displayed without such conversion, the EL display device is preferable. Note that, when a piezoelectric element is incorporated into the second display device, that is, the liquid crystal display device, a touch panel can be realized.

Figure 3A:
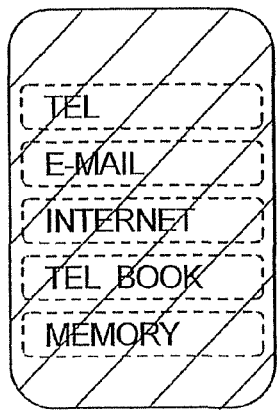
FIGS. 3A to 3C show switched screens.

FIG. 3A shows an example of an initial screen in the second display device 102. A telephone button, electronic mail button, an Internet button, a telephone book button, a memory button, and the like are displayed on the second display device 102.

Figure 3B:
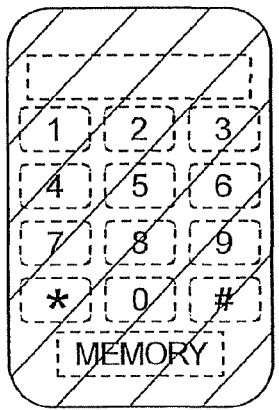

For example, when the telephone button displayed on the second display device 102 is pushed, the screen is switched to display dial buttons as shown in FIG. 3B. When the telephone number of the party on the other end is inputted using the displayed dial buttons, a telephone call to the party is allowed. When inputting the telephone number, it is desirable that the inputted number is displayed on the first display device 101 or the second display device 102.

Also, when the telephone book button displayed on the second display device 102 is pushed, a telephone number of the party on the other end, which is inputted in advance, is displayed and thus a telephone call is allowed. At this time, the telephone book may be displayed on the screen of the first display device 101 shown in FIGS. 1A to 1C.

Figure 3C:
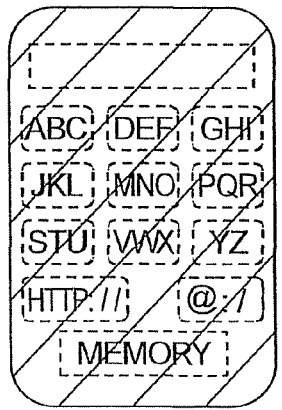

When an electronic mail button or an Internet button, which is displayed on the second display device 102, is pushed, the screen is switched to display keyboard buttons as shown in FIG. 3C. The address of an electronic mail or a URL (uniform resource locator) of a home page can be inputted using the displayed keyboard buttons. When portions corresponding to the displayed various input keys are touched, its display content data can be inputted. Note that the keyboard buttons can be suitably switched to a screen capable of inputting a capital letter, a lowercase letter, or a numeral. Also, Japanese characters can be inputted. At this time, it is desirable that the inputted number (data) is displayed on the first display device 101 or the second display device 102.

Also, when the telephone book button displayed on the second display device 102 is pushed, the address of the electronic mail, which is inputted in advance, is outputted and thus the electronic mail can be transmitted, or the URL of a home page is outputted and thus the home page can be referred to. At this time, the telephone book may be displayed on the screen of the first display device 101 shown in FIGS. 1A to 1C.

When the electronic mail to which an image such as a photograph or a picture is attached is received by the mobile telephone of this embodiment, the image is displayed on the first display device 101 capable of displaying an image with high quality, and characters and symbols in a text form can be displayed on the second display device 102. Also, while the image is displayed on the first display device 101, only data displayed on the screen of the second display device 102 is scrolled and thus a text can be read.

Also, not only the electronic mail to which an image is attached but also an electronic mail to which voice data is attached can be received.

For example, when a user views a home page by using the mobile telephone of this embodiment, an image such as a photograph or a picture on public view is displayed on the first display device 101 capable of displaying an image with high quality. Also, characters (text) indicating the explanation of the image, the message, or the like of the image are displayed on the second display device 102.

According to the present invention, both the image and the characters (text) can be simultaneously and easily viewed by using the mobile telephone.

Also, as in this embodiment, when the EL display device is used as the first display device 101 and the reflection type liquid crystal display device is used as the second display device 102, the display screen of the first display device 101 is made to be closer to the second display device 102 by light folding, and, even under low light conditions, the screen of the second display device 102 can be visually identified utilizing the light emitted from an EL element in the first display device 101.

Note that in this embodiment the example is shown in which the EL display device is used as the first display device 101 and the liquid crystal display device is used as the second display device 102. However, this should not be construed restrictively. A liquid crystal display device or an EL display device can be suitably used as the first display device 101 or the second display device 102.

Embodiment 2

The collapsible portable electronic device is described in Embodiment 1. In Embodiment 2, as shown in FIG. 2, a portable electronic device, in which a first display device 204 for displaying an image and a second display device 205 having a touch input operational portion are attached to each other in a longitudinal arrangement, will be described.

Note that this embodiment is the same structure as Embodiment 1 except for the configuration of the main body. Thus, a detailed description thereof will be omitted here.

In FIG. 2, reference numeral 201 denotes a main body, numeral 202 denotes a voice output portion, numeral 203 denotes a voice input portion, numeral 206 denotes an image of an operational switch, which is displayed on the second display device 205, numeral 207 denotes an operational switch, and numeral 208 denotes an antenna.

Note that the liquid crystal display device or the EL display device can be used as the first display device 204 or the second display device 205.

Embodiment 3

In this embodiment, an example of a portable electronic device having two or more display devices will be described. FIG. 4A is a side view and FIG. 4B is a perspective view. Note that this embodiment is the same structure as Embodiment 1 except for the number of display devices. Thus, a detailed description thereof will be omitted here.

As shown in FIGS. 4A and 4B, the portable electronic device of the present embodiment is a portable electronic device in which a first display device 401 and a second display device 402 are attached to each other so as to allow opening and closing with a third display device 403 therebetween.

In FIG. 4A, reference numeral 404 denotes an operational switch, numeral 405 denotes a voice output portion, numeral 406 denotes a voice input portion, and numeral 407 denotes an antenna.

Also, the first display device 401, the second display device 402, or the third display device 403 may be provided with a sensor for authentication of users. As the authentication of users, living body information (typically, fingerprint, palmar pattern, voice print, or the like) may be utilized.

Note that the liquid crystal display device or the EL display device can be used as the first display device 401, the second display device 402, or the third display device 403.

Embodiment 4

In this embodiment, an example of a portable electronic device having an image pickup device will be described. FIG. 5 is a perspective view.

Note that this embodiment is the same structure as Embodiment 1 except that an image pickup device to is provided. Thus, a detailed description thereof will be omitted here.

In FIG. 5, reference numeral 501 denotes a first display device, numeral 502 denotes a second display device, numeral 503 denotes an operational switch, numeral 504 denotes a voice output portion, numeral 505 denotes a voice input portion, numeral 506 denotes an antenna, and numeral 507 denotes an image input portion.

In this embodiment, a CCD image pickup device is used as the image input portion 507. Thus, while the user's face image is transmitted to the party on the other end and the face image of the other end is received from the party, a telephone call is permitted in the same manner as the normal conversation.

Also, this embodiment can be combined with any one of Embodiments 1 to 3.

Embodiment 5

In this embodiment, an example of a liquid crystal display device as the first display device or the second display device, which is shown in Embodiments 1 to 4, will be described.

Figure 6:
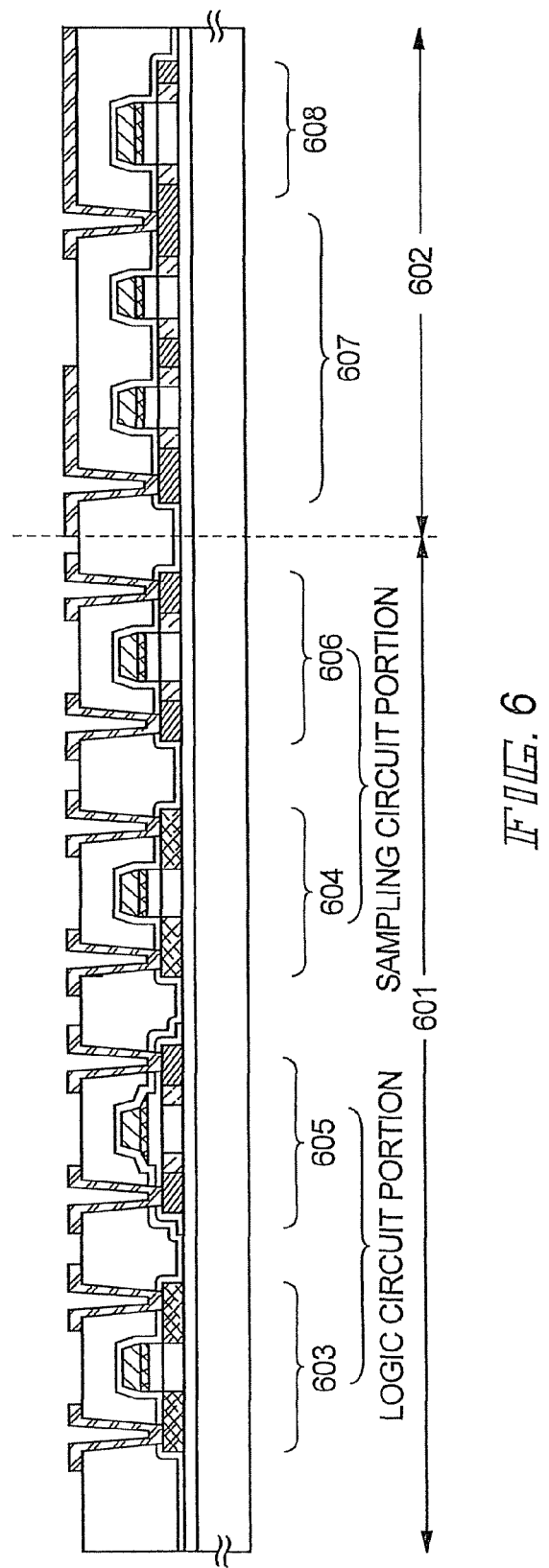
FIG. 6 is a cross sectional structure view of an active matrix liquid crystal display device (Embodiment 5)

An example of the liquid crystal display device having a pixel portion and a driver circuit for driving it on a substrate (note that it is in a state before a liquid crystal material sealing) is shown in FIG. 6.

Note that a CMOS circuit as a basic unit is shown as the driver circuit and one pixel is shown as the pixel portion.

In FIG. 6, a driver circuit 601 composed of n-channel TFTs 605 and 606 and p-channel TFTs 603 and 604 and a pixel portion 602 composed of a pixel TFT 607 as an n-channel TFT and a retaining capacitor 608 are formed on a substrate. Also, in this embodiment, all TFTs are formed as top gate TFTs.

Also, the pixel TFT 607 has a structure (double gate structure) where two channel forming regions are located between a source region and a drain region. However, this embodiment is not limited to the double gate structure. A single gate structure where one channel forming region is formed or a triple gate structure where three channel forming regions are formed may be used.

Also, in this embodiment, a pixel electrode connected with the drain region of the pixel TFT 607 is formed as a reflection electrode. As the material of the pixel electrode 610, it is desirable that a material with superior reflectivity, such as a film containing mainly Al or Ag or a laminate film of these be used. Also, it is preferable that after the formation of the pixel electrode, its surface is made uneven by a process using a sandblast method, an etching method, or the like, which is known. Thus, mirror reflection is prevented and reflection light is scattered to increase the degree of whiteness.

Note that in this embodiment, the example of the reflection liquid crystal display device using the reflection electrode as the pixel electrode is shown. However, a transmission liquid crystal display device using a transparent conductive film as the pixel electrode instead of the reflection electrode may be used.

After the state in FIG. 6 is obtained, an orientation film is formed on the pixel electrode and then rubbing processing is performed. Note that in this embodiment, before the formation of the orientation film, an organic resin film such as an acrylic resin film is patterned to form column-shaped spacers for keeping a substrate interval in predetermined positions. Instead of the column-shaped spacers, spherical spacers may be dispersed over the entire surface of the substrate.

Next, a counter substrate is prepared. After colored layers and a light shielding layer are formed on the counter substrate, a planarization film is faulted. Then, a counter electrode made of a transparent conductive film is formed in at least the pixel portion on the planarization film, an orientation film is formed on the entire surface of the counter substrate, and rubbing processing is performed.

Then, a stainless substrate in which the pixel portion and the driver circuit are formed and a fixing substrate are adhered to each other through an adhesion layer (seal member in this embodiment). Fillers are mixed with the adhesion layer. The two substrates are adhered to each other at a uniform interval by the fillers and the column-shaped spacers. After that, a liquid crystal material is injected between both substrates and completely sealed using a sealing agent (not shown). A known liquid crystal material may be used as the liquid crystal material.

Next, after the liquid crystal sealing (or filling) process is completed, a substrate holder is separated as described in the embodiment mode and in Embodiment 1. A state of the liquid crystal display device after that will be described using FIG. 7.

Figure 7:
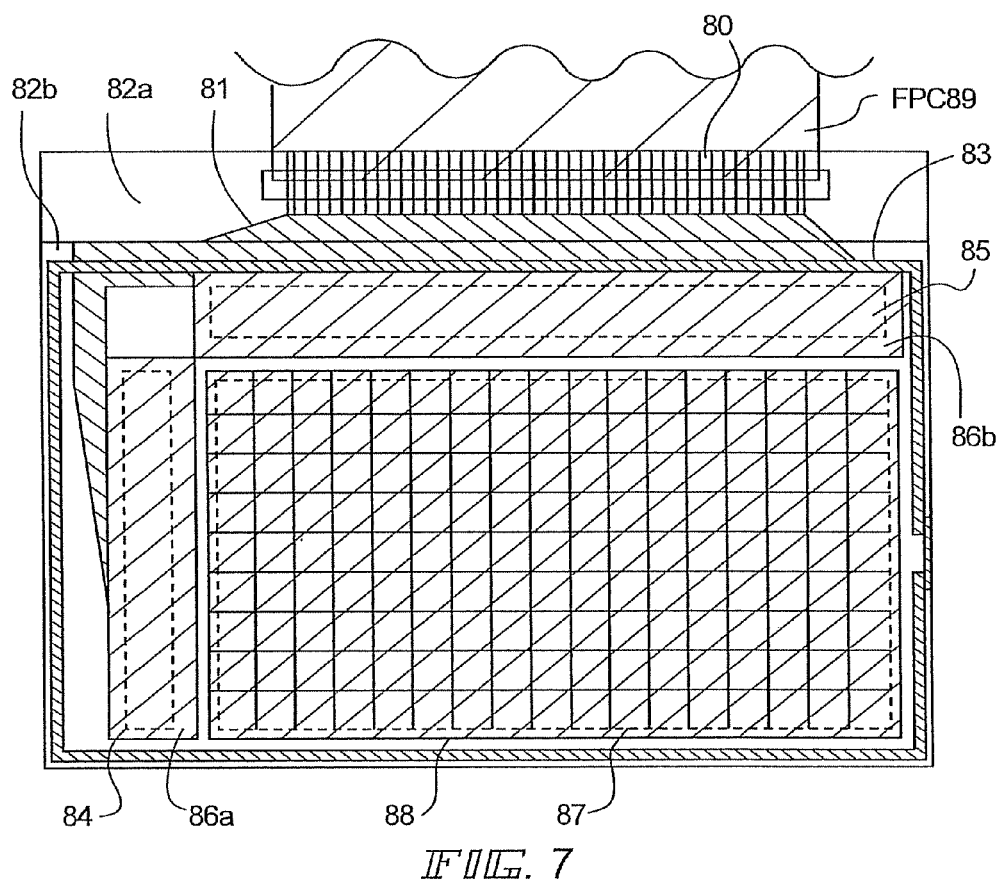
FIG. 7 is a top view of an active matrix liquid crystal display device (Embodiment 5)

In the top view shown in FIG. 7, a stainless substrate 82a and a counter substrate 82b in which a color filter and the like are provided are adhered to each other through a seal member 83. In the stainless substrate 82a, a pixel portion, driver circuits, an external input terminal 80 to which an FPC (flexible printed circuit) 89 is adhered, wiring 81 for connecting the external input terminal with input portions of the respective circuits, and the like are formed.

A light shielding layer 86a is provided on the counter substrate side so as to overlap a gate side driver circuit 84 and a light shielding layer 86b is formed on the counter substrate side no as to overlap a source side driver circuit 85. Also, in a color filter 88 which is provided on the counter substrate on a pixel portion 87, the light shielding layers and colored layers of respective colors of red (R), green (G), and blue (B) are provided corresponding to each pixel. In actual display, color display is made by three colors of the red (R) colored layer, the green (G) colored layer, and the blue (B) colored layer. The colored layers of the respective colors are arbitrarily arranged.

In this embodiment, the color filter 88 is provided in the counter substrate for colorization. However, in particular, the present invention is not restricted to this. When an element is formed on a substrate, a color filter may be formed over the substrate.

Also, the light shielding layer is provided between adjacent pixels in the color filter to light-shield a portion except for a display region. Further, the light shielding layers 86a and 86b are provided in a region covering the driver circuits. However, when the liquid crystal display device is incorporated as the display portion of the electronic equipment, the region covering the driver circuits is covered with a cover. Thus, a structure where the shielding layers are not provided may be used. When a necessary element is formed on a substrate, light shielding layers may be formed on the substrate.

Also, without providing the above light shielding layers, the colored layers composing the color filter may be suitably arranged between the counter substrate and the counter electrode such that light shielding is made with a laminate layer in which a plurality of layers are laminated. Thus, a portion (gap between respective pixel electrodes) except for the display region and the driver circuits are light-shielded.

Also, an FPC 89 made of a base film and wiring is adhered to the external input terminal through an anisotropic conductive resin. A reinforced plate is further provided to improve the mechanical strength.

Also, a polarization plate (not shown) is adhered to only the counter substrate.

The liquid crystal display device thus manufactured can be used as the first display device or the second display device in various electronic equipments described in Embodiments 1 to 4.

Also, the liquid crystal display device of this embodiment can be used as the third display device of Embodiment 3.

Figure 8A:
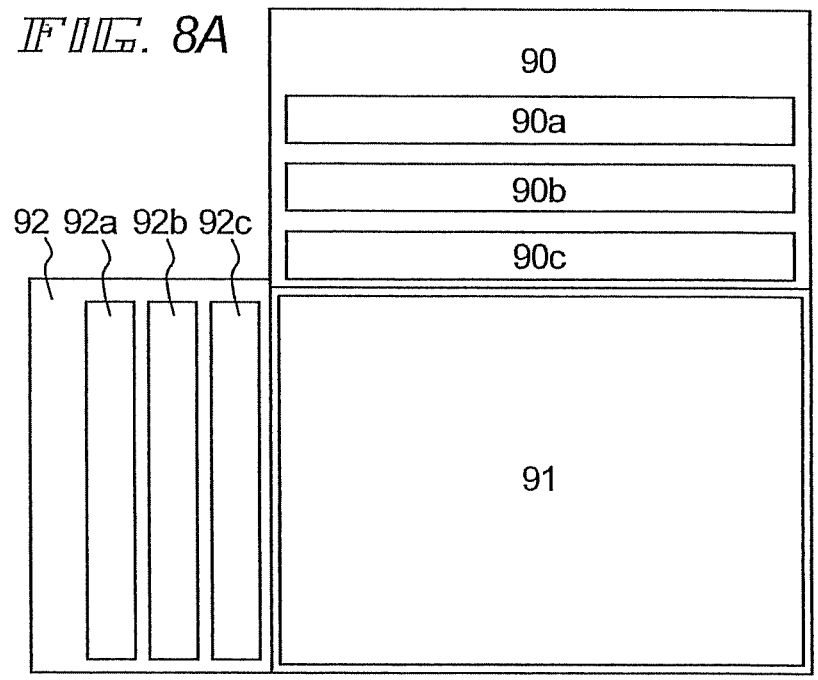
FIGS. 8A and 8B are circuit block diagrams.
Figure 8B:
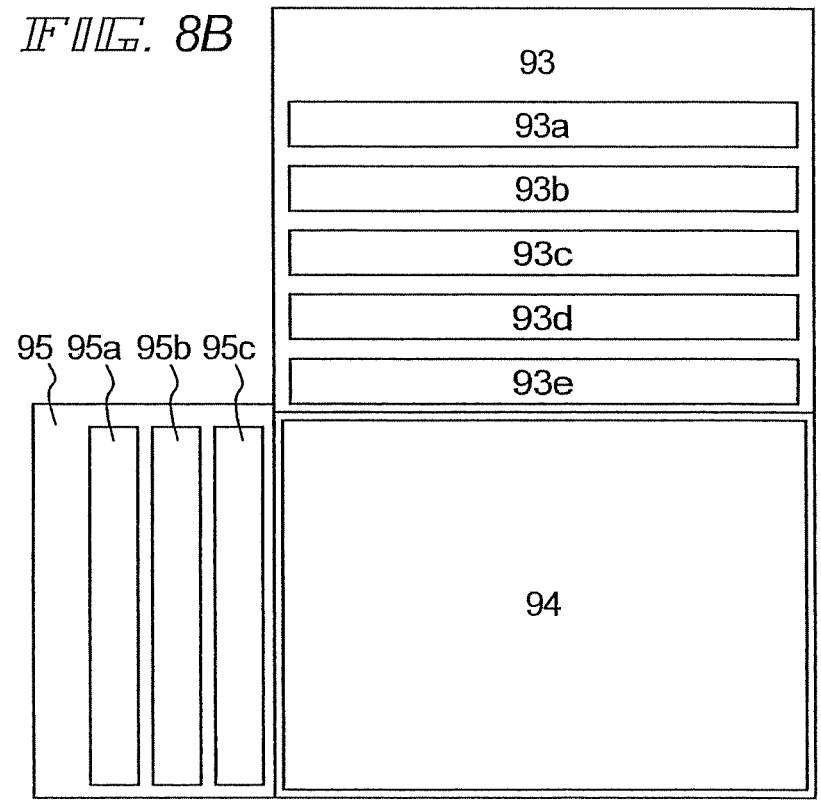

An example of a circuit structure of the liquid crystal display device of this embodiment is shown in FIGS. 8A and 8B.

Note that FIG. 8A shows a circuit structure for analog drive. In this embodiment, the liquid crystal display device has a source side driver circuit 90, a pixel portion 91, and a gate side driver circuit 92. Note that the term driver circuit in this specification covers the source side driver circuit and the gate side driver circuit.

In the source driver circuit 90, a shift register 90a, a buffer 90b, and a sampling circuit (transfer gate) 90c are provided. Also, in the gate side driver circuit 92, a shift register 92a, a level shifter 92b, and a buffer 92c are provided. If necessary, a level shifter circuit may be provided between the sampling circuit and the shift register.

Also, in this embodiment, the pixel portion 91 includes a plurality of pixels and a TFT element is provided for the respective pixels.

Also, the source side driver circuit 90 and the gate side driver circuit 92 can be formed using p-channel TFTs or n-channel TFTs.

Note that, although not shown, another gate side driver circuit may be provided on the opposite side of the gate side driver circuit 92 with the pixel portion 91 therebetween.

Also, in the case of digital drive, as shown in FIG. 8B, instead of the sampling circuit, a latch (A) 93b and a latch (B) 93c may be provided. In a source side driver circuit 93, a shift register 93a, the latch (A) 93b, the latch (B) 93c, a D/A converter 93d, and a buffer 93e are provided. Also, in the gate side driver circuit 95, a shift register 95a, a level shifter 95b, and a buffer 95c are provided. If necessary, a level shifter circuit may be provided between the latch (B) 93c and the D/A converter 93d.

Also, although only the structures of the pixel portion 91 or 94 and the driver circuit are described in this embodiment, a memory or a microprocessor further may be formed.

Embodiment 6

Figure 9A:
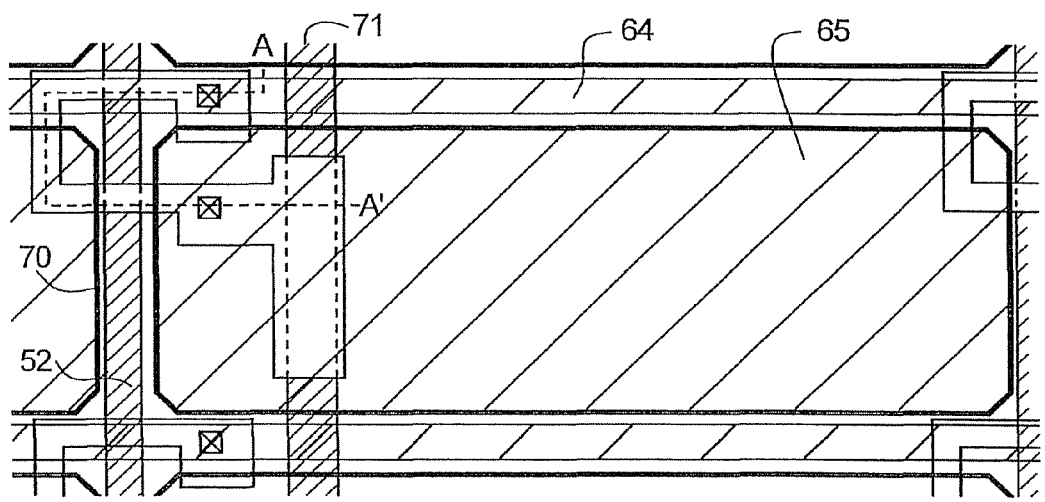
FIGS. 9A and 9B are a top view and a cross sectional view of an active matrix liquid crystal display device (Embodiment 6), respectively.
Figure 9B:
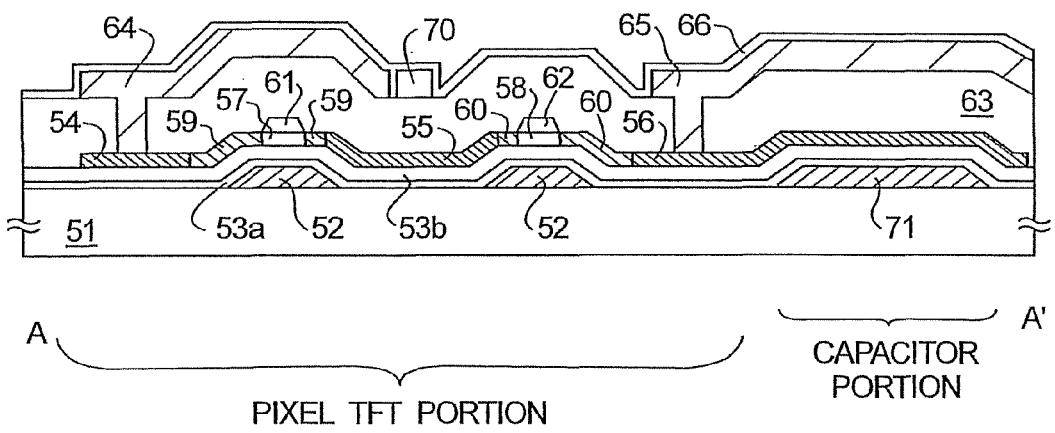

In this embodiment, an example, in which the TFT used for a pixel portion and driver circuits in the liquid crystal display device as the first display device or the second display device is formed by an inverse stagger TFT, is shown in FIGS. 9A and 9B. FIG. 9A is a top view in the case where one of pixels in the pixel portion is enlarged and a sectional view taken along a dot line A-A' in FIG. 9A is shown in FIG. 9B. Note that in FIG. 9B, reference numeral 51 denotes a substrate having an insulating surface.

In the pixel portion, a pixel TFT portion is formed of n-channel TFTs. A gate electrode 52 is formed on a substrate 51, and a first insulating film 53a of silicon nitride and a second insulating film 53b of silicon oxide are provided thereon. As active layers on the second insulating film 53b, $n^+$ type regions 54 to 56, channel forming regions 57 and 58, and $n^-$ type regions 59 and 60 located between the $n^+$ type regions and the channel forming regions are formed. The channel forming regions 57 and 58 are protected by insulating layers 61 and 62. After contact holes are formed in a first interlayer insulating film 63 which covers the insulating layers 61 and 62 and the active layers, wiring 64 connected with the $n^+$ type region 54 is formed, a pixel electrode 65 of Al, Ag, or the like is connected with the $n^+$ type region 56, and a passivation film 66 is formed thereon. Reference numeral 70 denotes a pixel electrode adjacent to a pixel electrode 65.

Note that in this embodiment, the gate wiring of the pixel 111 in the pixel portion is formed in a double gate structure. However, a multi-gate structure such as a triple gate structure may be used in order to reduce a variation in an off current. Further, a single gate structure may be used to improve an aperture ratio.

Also, a capacitor portion in the pixel portion is composed of the first insulating film 53a and the second insulating film 53b as dielectric, capacitor wiring 71, and the $n^+$ type region 56.

Note that the pixel portion shown in FIGS. 9A and 9B is merely shown as one example, and the present invention is not restricted to the above structure in particular.

Also, this embodiment can be combined with any one of Embodiments 1 to 5.

Embodiment 7

In this embodiment, an example of an EL (electroluminescence) display device as the first display device or the second display device, which is shown in Embodiments 1 to 4 will be described.

Figure 10:
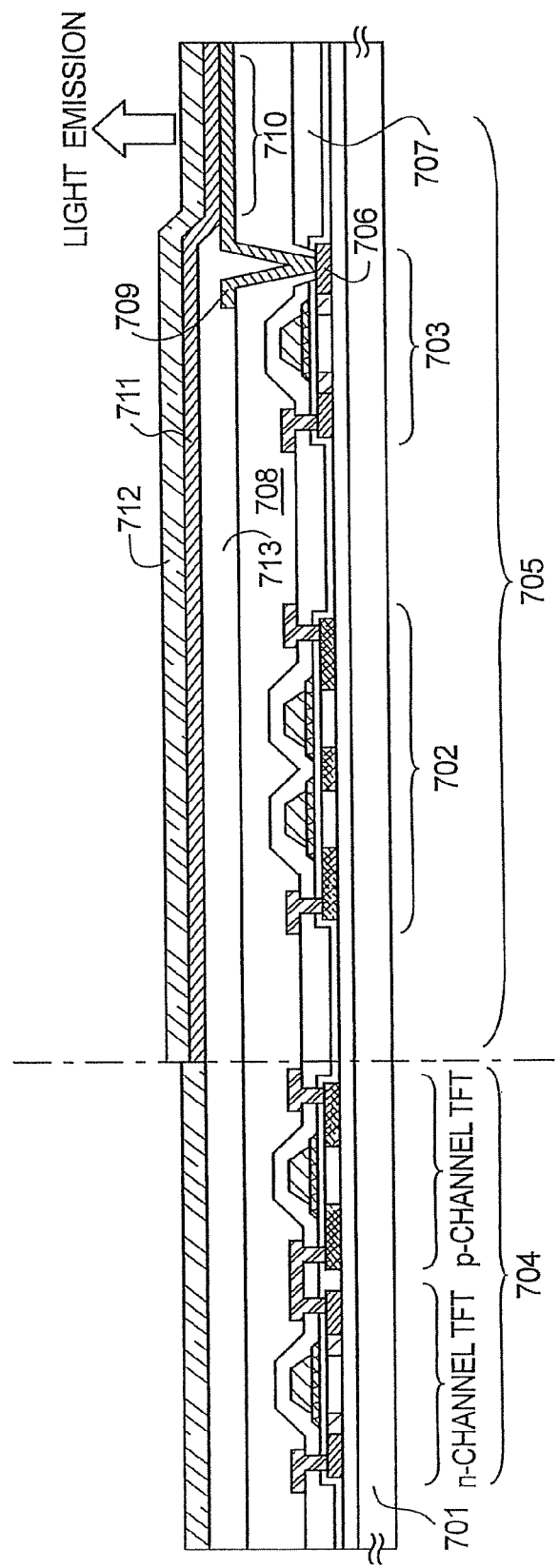
FIG. 10 is a cross sectional view of an active matrix EL display device (Embodiment 7)

An example of a light emitting device having a pixel portion and a driver circuit for driving it on the same substrate (note that a state before sealing) is shown in FIG. 10. Note that a CMOS circuit as a basic unit is shown in the driver circuit and one pixel is shown in the pixel portion.

In FIG. 10, reference numeral 701 denotes a substrate. An insulating film is formed on the substrate. A driver circuit 704 composed of an n-channel i and a p-channel TFT, and a pixel portion 705 comprising a switching TFT 702 composed of the a p-channel TFT and a current control TFT 703 composed of an n-channel TFT are formed thereon. Also, in this embodiment, all TFTs are formed as top gate TFTs.

Also, the switching TFT 702 has a structure (double gate structure) where two channel forming regions are located between a source region and a drain region. However, this embodiment is not restricted to the double gate structure. A single gate structure where one channel forming region is formed or a triple gate structure where three channel forming regions are formed may be used.

Also, before a second interlayer insulating film 708 is provided, a contact hole is provided in a first interlayer insulating film 707 on a drain region 706 of the current control TFT 703. This is because an etching process is simplified in the case where a contact hole is formed in the second interlayer insulating film 708. The contact hole is formed in the second interlayer insulating film 708 so as to reach the drain region 706 and a pixel electrode 709 connected with the drain region 706 is provided. The pixel electrode 709 is an electrode which functions as the cathode of an EL element and formed using a conductive film containing an element belonging to group 1 or 2 of the periodic table. In this embodiment, a conductive film made of a compound of lithium and aluminum is used.

Next, reference numeral 713 denotes an insulating film provided to cover end portions of the pixel electrode 709 and this insulating film is called a bank in this specification. The bank 713 may be formed using an insulating film containing silicon or a resin film. In the case where the resin film is used, when a carbon particle or a metal particle is added to the resin film such that resistivity thereof becomes $1 \times 10^6$ to $1 \times 10^{12}$ Ωm (preferably, $1 \times 10^8$ to $1 \times 10$ Ωm), the occurrence of dielectric breakdown at film formation can be suppressed.

Also, an EL element 710 is composed of the pixel electrode (cathode) 709, an EL layer 711, and an anode 712. As the anode 712, a conductive film having a large work function, typically an oxide conductive film is used. As the oxide conductive film, indium oxide, tin oxide, zinc oxide or a compound of these may be used. The light emitting device of this embodiment becomes a light emitting device for emitting light upward. Note that this embodiment is not restricted to the light emitting device for emitting light upward. If the structure of the light emitting device is suitably modified, the light emitting device for emitting light downward can be obtained.

Note that a laminate in which a hole injection layer, a hole transport layer, a hole blocking layer, an electron transport layer, an electron injection layer, or an electron blocking layer is combined with a luminescent layer is defined as an EL layer in this specification.

Also, if an EL material is used, the luminescent layer is not limited to a specific material. For example, a thin film made of a luminescent material (singlet compound) for luminescence by singlet excitation or a thin film made of a luminescent material (triplet compound) for luminescence by triplet excitation can be used.

Note that, although not shown here, after the anode 712 is formed, it is effective that a passivation film is provided so as to completely cover the EL layer 710. As the passivation film, an insulating film including a carbon film, a silicon nitride film, or a silicon oxynitride film as a single layer, or a laminate layer of those is used.

Next, a process up to a sealing (or filling) process for protecting the EL element is performed. The EL display device after the process will be described using FIGS. 11A and 11B.

Figure 11A:
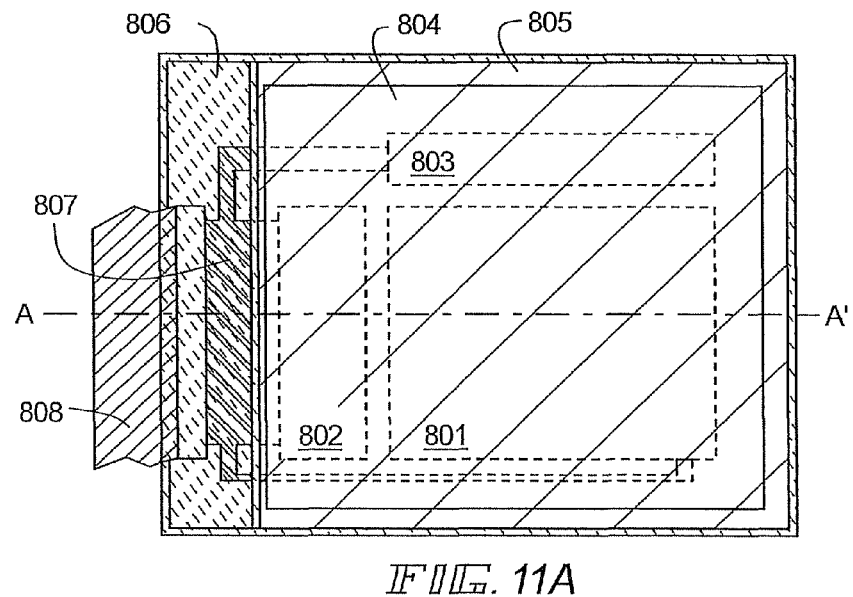
FIGS. 11A and 11B are a top view and a cross sectional view of an active matrix liquid crystal display device (Embodiment 7), respectively.
Figure 11B:
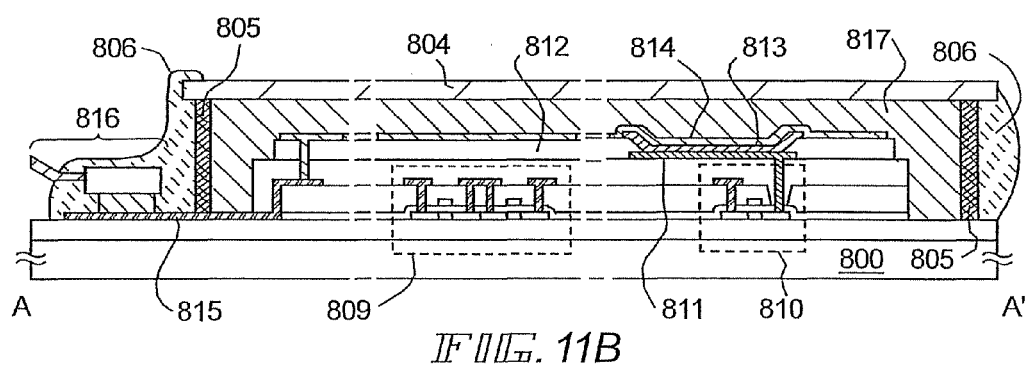

FIG. 11A is a top view showing astute where a process up to sealing of the EL element is performed and FIG. 11B is a cross sectional view taken along a line A-A' in FIG. 11A. As shown by dot lines, reference numeral 801 denotes a pixel portion, numeral 802 denotes a source side driver circuit, and numeral 803 denotes a gate side driver circuit. Also, reference numeral 804 denotes a cover member, numeral 805 denotes a first seal member, and numeral 806 denotes a second seal member.

Note that reference numeral 807 denotes wiring for transmitting signals to be inputted to the source side driver circuit 802 and the gate side driver circuit 803. The wiring 807 receives video signals and a clock signal from an FPC (flexible printed circuit) 808 as an external input terminal. Note that, although only the FPC is shown here, a printed wiring board (PWB) may be attached to the FPC.

Next, the cross sectional structure will be described using FIG. 11B. The pixel portion and the source side driver circuit 809 are formed over a substrate 800. The pixel portion is composed of a plurality of pixels. Each of the pixels includes a current control TFT 810 and a pixel electrode electrically connected with the drain thereof. The source side driver circuit 809 is constructed using a CMOS circuit in which an n-channel TFT and a p-channel TFT are combined with each other. Note that a polarization plate (typically a circular polarization plate) may be attached to the substrate 800.

Also, banks 812 are formed at both ends of the pixel electrode 811 and an EL layer 813 and an anode 814 of the EL element are formed on the pixel electrode 811. The anode 814 also function as wiring common to all pixels and is electrically connected with an FPC 816 through a connection wiring 815. Further, all elements included in the pixel portion and the source side driver circuit 809 are covered with a passivation film (not shown).

Also, the cover member 804 is adhered to the substrate 800 through the first seal member 805. Note that spacers may be provided to secure an interval between the cover member 804 and the EL element constant. A gap (space) 817 is produced inside the first seal member 805 and the substrate 800. It is desirable that the first seal member 805 is a material to which moisture or oxygen is not transmitted. Further, it is effective that a substance having a hygroscopic effect or a substance having an antioxidant effect is provided in the gap 817.

Note that a carbon film (specifically, a diamond like carbon film) is preferably provided as a protective film on the front surface and the rear surface of the cover member 804 with a thickness of 2 to 30 nm. Such a carbon film (not shown here) has the functions of preventing penetration of oxygen and water and mechanically protecting the surface of the cover member 804.

After the adhesion of the cover member 804, the second seal member 806 is provided so as to cover the exposed surface of the first seal member 805. The same material as the first seal member 805 can be used for the second seal member 806.

When the EL element is filled with the above structure, the EL element can be completely shielded from the exterior and the penetration of a substance which causes deterioration of the EL layer by oxidation, such as moisture or oxygen, from the exterior can be prevented. Therefore, the EL display device having high reliability is obtained.

The EL display device manufactured as described above can be used as the first display device or the second display device in various electronic equipment described in Embodiments 1 to 4.

Also, the EL display device of this embodiment can be used as the third display device in Embodiment 3.

Embodiment 8

In this embodiment, the structure of an external circuit connected with the second display device in Embodiment 1 will be described using FIG. 12.

Figure 12:
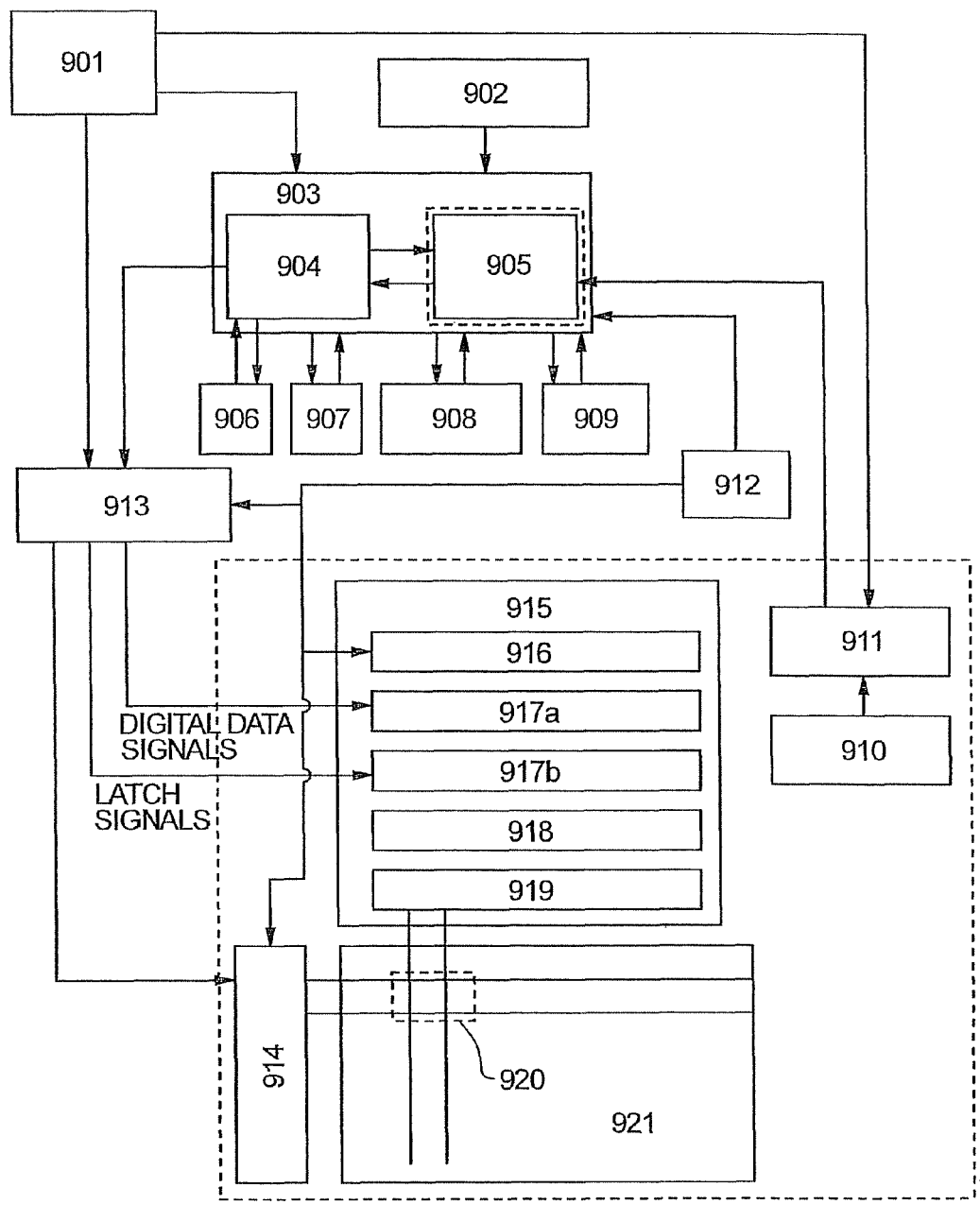
FIG. 12 is a circuit block diagram (Embodiment 8)

In a liquid crystal display device shown in FIG. 12, a pixel portion 921 composed of a pixel 920 driven by a TFT formed on a substrate, and a source side driver circuit 915 and a gate signal side driver circuit 914 used for driving the pixel portion are formed. The source side driver circuit 915 is shown as an example of digital drive and constructed by a shift register 916, latch circuits 917a and 917b, a D/A converter 918, and buffer circuit 919. Also, the gate signal side driver circuit 914 has a shift register, a buffer, and the like (not shown).

An external circuit connected with the liquid crystal display device is constructed by a power source circuit 901 composed of a stabilized power source and an operational amplifier with a high speed and high precision, an external interface port 902 having a USB terminal and the like, a CPU 903, a touch input tablet 910 used as an input means, a detection circuit 911, a clock signal oscillator 912, a control circuit 913, and the like. Note that the touch input tablet 910 (and the detection circuit 911) may be integrally formed in the inner portion of the second display device.

The CPU 903 includes an image signal processing circuit 904, a tablet interface 905 for inputting a signal from a touch input tablet 910, and the like. A VRAM 906, a DRAM 907, a flash memory 908, and a memory card 909 are connected with the CPU 903. Information processed by the CPU 903 is outputted as an image signal from the image signal processing circuit 904 to the control circuit 913. The control circuit 913 has the function of converting the image signal and a clock into respective timing specifications of the source side driver circuit 915 and the gate signal side driver circuit 914. Specifically, the control circuit 913 has the function of distributing the image signal as data corresponding to each pixel in the display device and the function of converting a horizontal synchronizing signal and a vertical synchronizing signal, which are inputted from the external, into start signals of the driver circuits and a timing control signal for alternating a built-in power source circuit.

Also, the control circuit 913 may be mounted using an IC chip by a COG method or integrally formed in the inner portion of the liquid crystal display device.

This embodiment can be combined with any one of Embodiments 1 to 6.

Embodiment 9

In this embodiment, an example in which an image pickup device (photo diode) is incorporated in each pixel of an EL display device as the first display device or the second display device, which is described in Embodiments 1 to 8, will be described.

Figure 13:
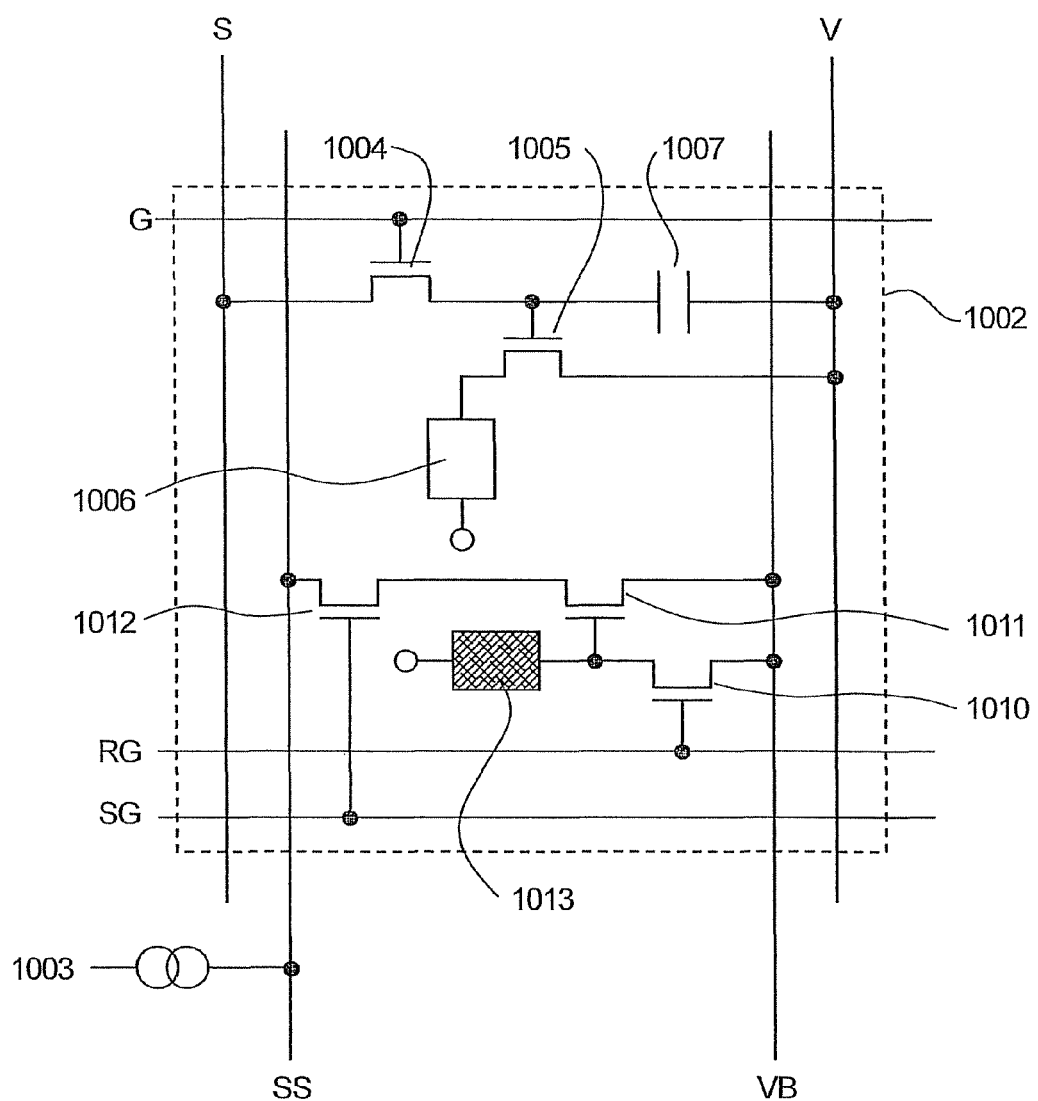
FIG. 13 is a circuit block diagram (Embodiment 9)

FIG. 13 shows the structure of a pixel 1002 in detail. A region enclosed by dot lines is the pixel 1002.

The pixel 1002 has a switching TFT 1004, an EL driving TFT 1005, and an EL element 1006. In FIG. 13, although a capacitor 1007 is provided in the pixel 1002, the capacitor 1007 may not be provided.

The EL element 1006 is composed of an anode, a cathode, and an EL layer provided between the anode and the cathode. When the cathode is connected with the source region or the drain region of the EL drive TFT 1005, the anode becomes the counter electrode and the cathode becomes the pixel electrode, and thus light is emitted downward. On the other hand, when the anode is connected with the source region or the drain region of the EL drive TFT 1005, the anode becomes the pixel electrode and the cathode becomes the counter electrode, and thus light is emitted upward.

The gate electrode of the switching TFT 1004 is connected with a gate signal line G. With respect to the source region and the drain region of the switching 1004, one region is connected with a source signal line S and the other region is connected with the gate electrode of the EL drive TFT 1005.

The source region of the EL drive TFT 1005 is connected with a power supply line V and the drain region thereof is connected with the EL element 1006. The capacitor 1007 is connected with the gate electrode of the EL drive TFT 1005 and the power supply line V.

Further, the pixel 1002 has a reset TFT 1010, a buffer TFT 1011, a selection TFT 1012, and a photo diode 1013.

The gate electrode of the reset TFT 1010 is connected with a reset gate signal line RG. The source region of the reset TFT 1010 is connected with a sensor power source line VB. The sensor power source line VB is always kept to be a constant potential (standard potential). Also, the drain region of the reset TFT 1010 is connected with the photo diode 1013 and the gate electrode of the buffer TFT 1011.

Although not shown, the photo diode 1013 has an N-type semiconductor layer, a P-type semiconductor layer, and a photoelectric conversion layer provided between the N-type semiconductor layer and the P-type semiconductor layer. Specifically, the drain region of the reset TFT 1010 is connected with, the P-type semiconductor layer or the N-type semiconductor layer of the photo diode 1013.

The drain region of the buffer TFT 1011 is connected with the sensor power source line VB and always kept to be a constant standard potential. The source region of the buffer TFT 1011 is connected with the source region or the drain region of the selection TFT 1012.

The gate electrode of the selection TFT 1012 is connected with a sensor gate signal line SG. With respect to the source region and the drain region of the selection TFT 1012, one region is connected with the source region of the buffer TFT 1011 as described above and the other region is connected with a sensor output wiring SS. The sensor output wiring SS is connected with a constant current power source 1003 and a constant current always flows into the sensor output wiring SS.

Figure 14:
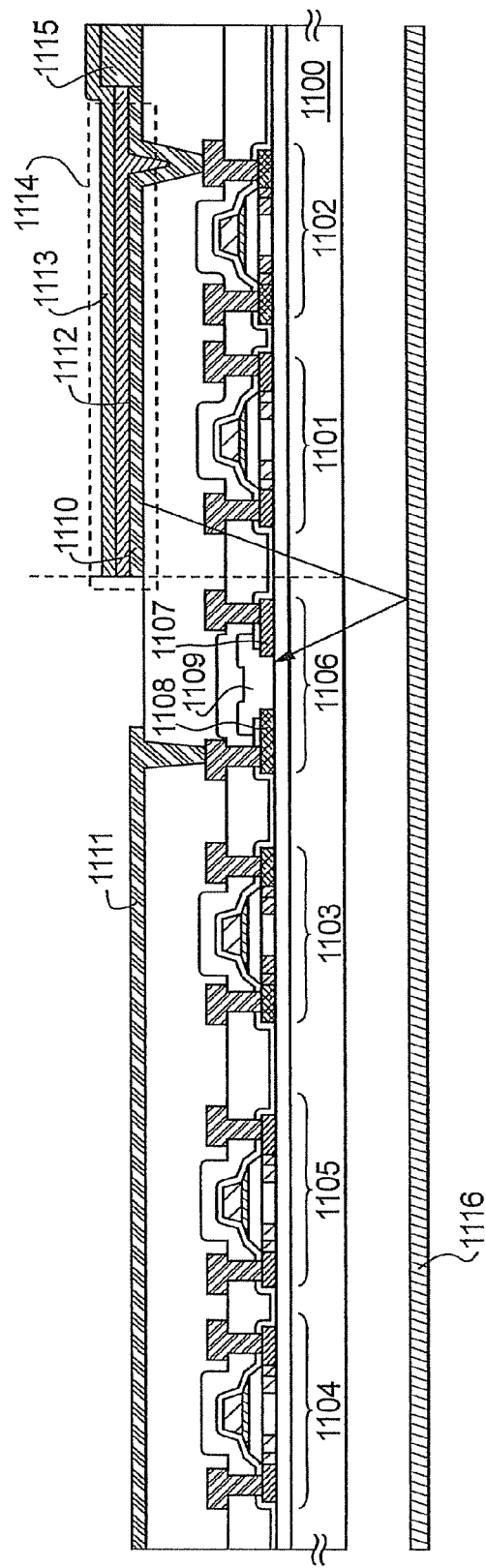
FIG. 14 is a cross sectional view of an EL display device (Embodiment 9)

FIG. 14 shows a cross sectional view of this embodiment. Reference numeral 1101 denotes a switching TFT, numeral 1102 denotes an EL driving TFT, numeral 1103 denotes a reset TFT, numeral 1104 denotes a buffer TFT, and numeral 1105 denotes a selection TFT.

Also, reference numeral 1108 denotes a P-type semiconductor layer, numeral 1109 denotes a photoelectric conversion layer, and numeral 1107 denotes an N-type semiconductor layer. A photo diode 1106 is formed of the P-type semiconductor layer 1108, the photoelectric conversion layer 1109, and the N-type semiconductor layer 1107. Reference numeral 1111 denotes a sensor wiring and the sensor wiring 1111 is used to electrically connect the N-type semiconductor layer 1107 with an external power source. The P-type semiconductor layer 1108 of the photo diode 1106 is electrically connected with the drain region of the reset TFT 1103.

Also, reference numeral 1110 denotes a pixel electrode (anode), numeral 1112 denotes an EL layer, and numeral 1113 denotes a counter electrode (cathode). An EL element 1114 is composed of the pixel electrode (anode) 1110, the EL layer 1112, and the counter electrode (cathode) 1113. Note that reference numeral 1115 indicates a bank and the EL layers 1112 of adjacent pixels are separated by the bank.

Reference numeral 1116 denotes an object to be photographed. Light emitted from the EL element 1114 is reflected by the object 1116 to be photographed and irradiated into the photo diode 1106. In this embodiment, the object to be photographed is provided at the side of the substrate 1100, where TFTs are not formed.

In this embodiment, the switching TFT 1101, the buffer TFT 1104, and the selection TFT 1105 are all N-channel TFTs. Also, the EL driving TFT 1102 and the reset TFT 1103 are P-channel TFTs. Note that the present invention is not restricted to this structure. Thus, the switching TFT 1101, the EL driving TFT 1102, the buffer TFT 1104, the selection TFT 1105, and the reset TFT 1103 may be any one of N-channel TFTs and P-channel TFTs.

Note that, as described in this embodiment, when the source region or the drain region of the EL driving TFT 1102 is electrically connected with the anode 1110 of the EL element 1114, it is desirable that the EL driving TFT 1102 is a P-channel TFT. On the other hand, when the source region or the drain region of the EL driving TFT 1102 is electrically connected with the cathode of the EL element 1114, it is desirable that the EL driving TFT 1102 is an N-channel TFT.

Note that, since the photo diode of this embodiment can be simultaneously formed together with other TFTs, the number of processes can be decreased.

This embodiment can be combined with any one of Embodiments 1 to 7.

Embodiment 10

Figure 15:
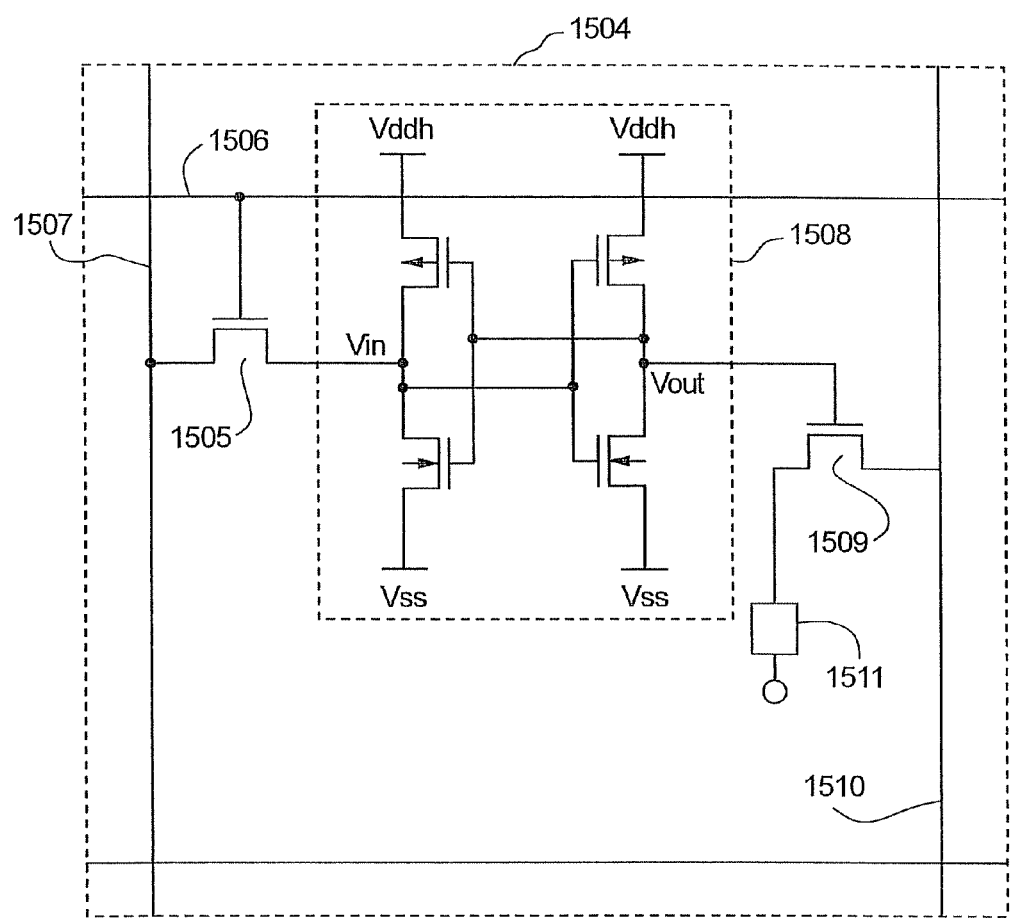
FIG. 15 is a circuit block diagram (Embodiment 10).

In this embodiment, an example in which a memory element (SRAM) is incorporated in each pixel of an EL display device as the first display device or the second display device, which is described in Embodiments 1 to 8, will be described. FIG. 15 is an enlarged view of a pixel 1504.

In FIG. 15, reference numeral 1505 denotes a switching TFT. The gate electrode of the switching TFT 1505 is connected with a gate signal line 1506 as one of gate signal lines (G1 to Gn) for inputting gate signals. With respect to the source region and the drain region of the switching TFT 1505, one region is connected with a source signal line 1507 as one of source signal lines (S1 to Sn) for inputting signals and the other region is connected with the input side of an SRAM 1508. The output side of the SRAM 1508 is connected with the gate electrode of a current control TFT 1509.

With respect to the source region and the drain region of the current control TFT 1509, one region is connected with a current supply line 1510 as one of current supply lines (V1 to Vn) and the other region is connected with an EL element 1511.

The EL element 1511 is composed of an anode, a cathode, and an EL layer provided between the anode and the cathode. When the anode is connected with the source region or the drain region of the current control TFT 1509, in other words, when the anode is a pixel electrode, the cathode becomes a counter electrode. On the other hand, when the cathode is connected with the source region or the drain region of the current control TFT 1509, in other words, when the cathode is a pixel electrode, the anode becomes a counter electrode.

The SRAM 1508 has two p-channel TFTs and two n-channel TFTs. The source regions of the p-channel TFTs are connected with Vddh at a high voltage side and the source regions of the n-channel TFTs are connected with Vss at a low voltage side. One p-channel TFT and one n-channel TFT make a pair. In one SRAM, two pairs of p-channel TFT and n-channel TFT are present.

With respect to a pair of p-channel TFT and n-channel TFT, the drain regions are connected with each other. Also, with respect to a pair of p-channel TFT and n-channel TFT, the gate electrodes are connected with each other. The drain regions in one pair of p-channel TFT and n-channel TFT are kept to be the same potential as the gate electrodes in the other pair of p-channel TFT and n-channel TFT.

The drain regions in one pair of p-channel TFT and n-channel TFT constitute the input side in which an input signal (Vin) is inputted. The drain regions in the other pair of p-channel TFT and n-channel TFT constitute the output side in which an output signal (Vout) is outputted.

The SRAM is designed to hold Vin and output Vout as a signal obtained by inverting Vin. That is, when Vin is Hi, Vout becomes a Lo signal corresponding to Vss. On the other hand, when Vin is Lo, Vout becomes a Hi signal corresponding to Vddh.

Note that, as described in this embodiment, when one SRAM is provided in the pixel 1504, since memory data in the pixel is held, a still image can be displayed in a state in which most of the external circuits are stopped. Thus, low power consumption can be realized.

Also, a plurality of SRAMs can be provided in the pixel. When the plurality of SRAMs are provided in the pixel, a plurality of data can be held. Thus, gradation display with time gradation is possible.

The structure of this embodiment can be freely combined with any one of the structures of Embodiments 1 to 9.

According to the present invention, a portion of conventional operational buttons is made to be a display screen. Thus, a display region can be expanded without changing the outer size of the electronic device and much information can be displayed at once.

According to the present invention, both the image and the characters (text) can be simultaneously and easily seen with a high resolution by using the mobile telephone.

What is claimed is:

1. A portable electronic device comprising:
a pixel portion comprising a pixel;
a touch input operational portion;
a detection circuit operationally connected to the touch input operational portion;
a first driver circuit electrically connected to the pixel portion;
a second driver circuit electrically connected to the pixel portion;
a source driver circuit electrically connected to the pixel portion;
a CPU operationally connected to the detection circuit;
a flash memory operationally connected to the CPU; and
a DRAM operationally connected to the CPU,
wherein the CPU is operationally connectable to a memory card,
wherein the pixel portion is formed between the first driver circuit and the second driver circuit,
wherein a digital image signal is inputted to the source driver circuit,
wherein the pixel comprises first, second, third, fourth, fifth, and sixth TFTs and an EL element,
wherein the EL element comprises a pixel electrode,
wherein the first, second, third, fourth, fifth, and sixth TFTs are covered with a first insulating film,
wherein the pixel electrode is formed over the first insulating film, and
wherein an end portion of the pixel electrode is covered with a second insulating film.

2. The portable electronic device according to claim 1, wherein the pixel comprises an SRAM,
the SRAM comprises the second, third, fourth, and fifth TFTs.

3. The portable electronic device according to claim 1, wherein the touch input operational portion is formed in the pixel portion.

4. The portable electronic device according to claim 1, wherein the pixel comprises a photo diode.

5. A portable electronic device comprising:
a pixel portion comprising a pixel;
a touch input operational portion;
a detection circuit operationally connected to the touch input operational portion;
a first driver circuit electrically connected to the pixel portion;
a second driver circuit electrically connected to the pixel portion;
a source driver circuit electrically connected to the pixel portion;
a CPU operationally connected to the detection circuit;
a flash memory operationally connected to the CPU; and
a DRAM operationally connected to the CPU,
wherein the CPU is operationally connectable to a memory card,
wherein the pixel portion is formed between the first driver circuit and the second driver circuit,
wherein a digital image signal is inputted to the source driver circuit,
wherein the pixel comprises first, second, third, fourth, fifth, and sixth TFTs and an EL element,
wherein the EL element comprises a pixel electrode,
wherein the pixel electrode is electrically connected to a first terminal of the first TFT,
wherein a gate of the second TFT is directly connected to a gate of the third TFT,
wherein a gate of the fourth TFT is directly connected to a gate of the fifth TFT,
wherein a first terminal of the sixth TFT is electrically connected to a first terminal of the fourth TFT,
wherein a first terminal of the third TFT is electrically connected to a gate of the first TFT,
wherein a first terminal of the second TFT is electrically connected to the first terminal of the third TFT, wherein the first, second, third, fourth, fifth, and sixth TFTs are covered with a first insulating film,
wherein the pixel electrode is formed over the first insulating film, and
wherein an end portion of the pixel electrode is covered with a second insulating film.

6. The portable electronic device according to claim 5, wherein the pixel comprises an SRAM,
the SRAM comprises the second, third, fourth, and fifth TFTs.

7. The portable electronic device according to claim 5, wherein the touch input operational portion is formed in the pixel portion.

8. The portable electronic device according to claim 5, wherein the pixel comprises a photo diode.

9. A portable electronic device comprising:
a pixel portion comprising a pixel:
a touch input operational portion;
a detection circuit operationally connected to the touch input operational portion;
a first driver circuit electrically connected to the pixel portion;
a second driver circuit electrically connected to the pixel portion;
a source driver circuit electrically connected to the pixel portion;
a CPU operationally connected to the detection circuit;
a flash memory operationally connected to the CPU; and
a DRAM operationally connected to the CPU,
wherein the pixel portion is formed between the first driver circuit and the second driver circuit,
wherein a digital image signal is inputted to the source driver circuit,
wherein the pixel comprises first, second, third, fourth, fifth, and sixth TFTs and an EL element,
wherein the EL element comprises a pixel electrode,
wherein the first, second, third, fourth, fifth, and sixth TFTs are covered with a first insulating film,
wherein the pixel electrode is formed over the first insulating film, and
wherein an end portion of the pixel electrode is covered with a second insulating film.

10. The portable electronic device according to claim 9, wherein the pixel comprises an SRAM,
the SRAM comprises the second, third, fourth, and fifth TFTs.

11. The portable electronic device according to claim 9, wherein the touch input operational portion is formed in the pixel portion.

12. The portable electronic device according to claim 9, wherein the pixel comprises a photo diode.

13. A portable electronic device comprising:
a pixel portion comprising a pixel:
a touch input operational portion;
a detection circuit operationally connected to the touch input operational portion;
a first driver circuit electrically connected to the pixel portion;
a second driver circuit electrically connected to the pixel portion;
a source driver circuit electrically connected to the pixel portion;
a CPU operationally connected to the detection circuit;
a flash memory operationally connected to the CPU; and
a DRAM operationally connected to the CPU,
wherein the pixel portion is formed between the first driver circuit and the second driver circuit,
wherein a digital image signal is inputted to the source driver circuit,
wherein the pixel comprises first, second, third, fourth, fifth, and sixth TFTs and an EL element,
wherein the EL element comprises a pixel electrode,
wherein the pixel electrode is electrically connected to a first terminal of the first TFT,
wherein a gate of the second TFT is directly connected to a gate of the third TFT,
wherein a gate of the fourth TFT is directly connected to a gate of the fifth TFT,
wherein a first terminal of the sixth TFT is electrically connected to a first terminal of the fourth TFT,
wherein a first terminal of the third TFT is electrically connected to a gate of the first TFT,
wherein a first terminal of the second TFT is electrically connected to the first terminal of the third TFT,
wherein the first, second, third, fourth, fifth, and sixth TFTs are covered with a first insulating film,
wherein the pixel electrode is formed over the first insulating film, and
wherein an end portion of the pixel electrode is covered with a second insulating film.

14. The portable electronic device according to claim 13, wherein the pixel comprises an SRAM,
the SRAM comprises the second, third, fourth, and fifth TFTs.

15. The portable electronic device according to claim 13, wherein the touch input operational portion is formed in the pixel portion.

16. The portable electronic device according to claim 13, wherein the pixel comprises a photo diode.

17. A portable electronic device comprising:
a pixel portion comprising a pixel:
a touch input operational portion;
a detection circuit operationally connected to the touch input operational portion;
a first driver circuit electrically connected to the pixel portion;
a second driver circuit electrically connected to the pixel portion;
a source driver circuit electrically connected to the pixel portion;
a CPU operationally connected to the detection circuit;
a flash memory operationally connected to the CPU; and
a DRAM operationally connected to the CPU,
wherein the CPU is operationally connectable to a memory card,
wherein the pixel portion is formed between the first driver circuit and the second driver circuit,
wherein a digital image signal is inputted to the source driver circuit,
wherein the pixel comprises first and second TFTs and an EL element,
wherein the EL element comprises a pixel electrode,
wherein the first and second TFTs are covered with a first insulating film,
wherein the pixel electrode is formed over the first insulating film, and
wherein an end portion of the pixel electrode is covered with a second insulating film.

18. The portable electronic device according to claim 17, wherein the pixel comprises an SRAM,
the SRAM comprises the first and second TFTs.

19. The portable electronic device according to claim 17, wherein the touch input operational portion is formed in the pixel portion.

20. The portable electronic device according to claim 17, wherein the pixel comprises a photo diode.

21. A portable electronic device comprising:
a pixel portion comprising a pixel:
a touch input operational portion;
a detection circuit operationally connected to the touch input operational portion;
a first driver circuit electrically connected to the pixel portion;
a second driver circuit electrically connected to the pixel portion; and
a source driver circuit electrically connected to the pixel portion;
wherein the pixel portion is formed between the first driver circuit and the second driver circuit,
wherein a digital image signal is inputted to the source driver circuit,
wherein the pixel comprises first, second, third, fourth, fifth, and sixth TFTs and an EL element,
wherein the EL element comprises a pixel electrode,
wherein the first, second, third, fourth, fifth, and sixth TFTs are covered with a first insulating film,
wherein the pixel electrode is formed over the first insulating film, and
wherein an end portion of the pixel electrode is covered with a second insulating film.

22. The portable electronic device according to claim 21, wherein the pixel comprises an SRAM,
the SRAM comprises the second, third, fourth, and fifth TFTs.

23. The portable electronic device according to claim 21, wherein the touch input operational portion is formed in the pixel portion.

24. The portable electronic device according to claim 21, wherein the pixel comprises a photo diode.

25. A portable electronic device comprising:
a pixel portion comprising a pixel:
a touch input operational portion;
a detection circuit operationally connected to the touch input operational portion;
a first driver circuit electrically connected to the pixel portion;
a second driver circuit electrically connected to the pixel portion; and
a source driver circuit electrically connected to the pixel portion;
wherein the pixel portion is formed between the first driver circuit and the second driver circuit,
wherein a digital image signal is inputted to the source driver circuit,
wherein the pixel comprises first, second, third, fourth, fifth, and sixth TFTs and an EL element,
wherein the EL element comprises a pixel electrode,
wherein the pixel electrode is electrically connected to a first terminal of the first TFT,
wherein a gate of the second TFT is directly connected to a gate of the third TFT,
wherein a gate of the fourth TFT is directly connected to a gate of the fifth TFT,
wherein a first terminal of the sixth TFT is electrically connected to a first terminal of the fourth TFT,
wherein a first terminal of the third TFT is electrically connected to a gate of the first TFT,
wherein a first terminal of the second TFT is electrically connected to the first terminal of the third TFT,
wherein the first, second, third, fourth, fifth, and sixth TFTs are covered with a first insulating film,
wherein the pixel electrode is formed over the first insulating film, and
wherein an end portion of the pixel electrode is covered with a second insulating film.

26. The portable electronic device according to claim 25, wherein the pixel comprises an SRAM,
the SRAM comprises the second, third, fourth, and fifth TFTs.

27. The portable electronic device according to claim 25, wherein the touch input operational portion is formed in the pixel portion.

28. The portable electronic device according to claim 25, wherein the pixel comprises a photo diode.

29. A portable electronic device comprising:
a pixel portion comprising a pixel:
a touch input operational portion;
a detection circuit operationally connected to the touch input operational portion;
a first driver circuit electrically connected to the pixel portion;
a second driver circuit electrically connected to the pixel portion;
a source driver circuit electrically connected to the pixel portion;
a CPU operationally connected to the detection circuit;
a flash memory operationally connected to the CPU; and
a DRAM operationally connected to the CPU,
wherein the pixel portion is formed between the first driver circuit and the second driver circuit,
wherein a digital image signal is inputted to the source driver circuit,
wherein the pixel comprises first, second, third, fourth, fifth, and sixth TFTs and an EL element,
wherein the EL element comprises a pixel electrode,
wherein the pixel electrode is electrically connected to a first terminal of the first TFT,
wherein a first terminal of the sixth TFT is electrically connected to a first terminal of the fourth TFT,
wherein a first terminal of the third TFT is electrically connected to a gate of the first TFT,
wherein a first terminal of the second TFT is electrically connected to the first terminal of the third TFT,
wherein the first, second, third, fourth, fifth, and sixth TFTs are covered with a first insulating film,
wherein the pixel electrode is formed over the first insulating film, and
wherein an end portion of the pixel electrode is covered with a second insulating film.

30. The portable electronic device according to claim 29, wherein the pixel comprises an SRAM,
the SRAM comprises the second, third, fourth, and fifth TFTs.

31. The portable electronic device according to claim 29, wherein the touch input operational portion is formed in the pixel portion.

32. The portable electronic device according to claim 29, wherein the pixel comprises a photo diode.

33. A portable electronic device comprising:
a pixel portion comprising a pixel;
a touch input operational portion;
a detection circuit operationally connected to the touch input operational portion;
a first driver circuit electrically connected to the pixel portion;
a second driver circuit electrically connected to the pixel portion;

a source driver circuit electrically connected to the pixel portion;
a CPU operationally connected to the detection circuit;
a flash memory operationally connected to the CPU; and
a DRAM operationally connected to the CPU,
wherein the CPU is operationally connectable to a memory card,
wherein the pixel portion is formed between the first driver circuit and the second driver circuit,
wherein a digital image signal is inputted to the source driver circuit,
wherein the pixel comprises first, second, third, fourth, fifth, and sixth TFTs and an EL element,
wherein the EL element comprises a pixel electrode,
wherein the pixel electrode is electrically connected to a first terminal of the first TFT,
wherein a gate of the second TFT is directly connected to a gate of the third TFT,
wherein a gate of the fourth TFT is directly connected to a gate of the fifth TFT,
wherein a first terminal of the third TFT is electrically connected to a gate of the first TFT,
wherein the first, second, third, fourth, fifth, and sixth TFTs are covered with a first insulating film,
wherein the pixel electrode is formed over the first insulating film, and
wherein an end portion of the pixel electrode is covered with a second insulating film.

34. The portable electronic device according to claim 33, wherein the pixel comprises an SRAM,
the SRAM comprises the second, third, fourth, and fifth TFTs.

35. The portable electronic device according to claim 33, wherein the touch input operational portion is formed in the pixel portion.

36. The portable electronic device according to claim 33, wherein the pixel comprises a photo diode.

37. A portable electronic device comprising:
a pixel portion comprising a pixel:
a touch input operational portion;
a detection circuit operationally connected to the touch input operational portion;
a first driver circuit electrically connected to the pixel portion;
a second driver circuit electrically connected to the pixel portion;
a source driver circuit electrically connected to the pixel portion;
a CPU operationally connected to the detection circuit;
a flash memory operationally connected to the CPU; and
a DRAM operationally connected to the CPU,
wherein the pixel portion is formed between the first driver circuit and the second driver circuit,
wherein a digital image signal is inputted to the source driver circuit,
wherein the pixel comprises first, second, third, fourth, fifth, and sixth TFTs and an EL element,
wherein the EL element comprises a pixel electrode,
wherein the pixel electrode is electrically connected to a first terminal of the first TFT,
wherein a gate of the second TFT is directly connected to a gate of the third TFT,
wherein a gate of the fourth TFT is directly connected to a gate of the fifth TFT,
wherein a first terminal of the third TFT is electrically connected to a gate of the first TFT,
wherein the first, second, third, fourth, fifth, and sixth TFTs are covered with a first insulating film,
wherein the pixel electrode is formed over the first insulating film, and
wherein an end portion of the pixel electrode is covered with a second insulating film.

38. The portable electronic device according to claim 37, wherein the pixel comprises an SRAM,
the SRAM comprises the second, third, fourth, and fifth TFTs.

39. The portable electronic device according to claim 37, wherein the touch input operational portion is formed in the pixel portion.

40. The portable electronic device according to claim 37, wherein the pixel comprises a photo diode.

41. A portable electronic device comprising:
a pixel portion comprising a pixel:
a touch input operational portion;
a detection circuit operationally connected to the touch input operational portion;
a first driver circuit electrically connected to the pixel portion;
a second driver circuit electrically connected to the pixel portion; and
a source driver circuit electrically connected to the pixel portion;
wherein the pixel portion is formed between the first driver circuit and the second driver circuit,
wherein a digital image signal is inputted to the source driver circuit,
wherein the pixel comprises first, second, third, fourth, fifth, and sixth TFTs and an EL element,
wherein the EL element comprises a pixel electrode,
wherein the pixel electrode is electrically connected to a first terminal of the first TFT,
wherein a gate of the second TFT is directly connected to a gate of the third TFT,
wherein a gate of the fourth TFT is directly connected to a gate of the fifth TFT,
wherein a first terminal of the sixth TFT is electrically connected to a first terminal of the fourth TFT,
wherein a first terminal of the third TFT is electrically connected to a gate of the first TFT,
wherein a first terminal of the second TFT is electrically connected to the first terminal of the third TFT,
wherein the first, second, third, fourth, fifth, and sixth TFTs are covered with a first insulating film,
wherein the pixel electrode is formed over the first insulating film, and
wherein an end portion of the pixel electrode is covered with a second insulating film.

42. The portable electronic device according to claim 41, wherein the pixel comprises an SRAM,
the SRAM comprises the second, third, fourth, and fifth TFTs.

43. The portable electronic device according to claim 41, wherein the touch input operational portion is formed in the pixel portion.

44. The portable electronic device according to claim 41, wherein the pixel comprises a photo diode.

* * * * *